(12) United States Patent
Noda et al.

(10) Patent No.: US 9,691,772 B2
(45) Date of Patent: Jun. 27, 2017

(54) SEMICONDUCTOR MEMORY DEVICE INCLUDING MEMORY CELL WHICH INCLUDES TRANSISTOR AND CAPACITOR

(75) Inventors: Kosei Noda, Atsugi (JP); Yuta Endo, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 13/402,194

(22) Filed: Feb. 22, 2012

(65) Prior Publication Data

US 2012/0223310 A1 Sep. 6, 2012

(30) Foreign Application Priority Data

Mar. 3, 2011 (JP) ................. 2011-045913

(51) Int. Cl.
*H01L 29/786* (2006.01)
*H01L 27/108* (2006.01)
*H01L 21/02* (2006.01)
*H01L 27/12* (2006.01)
*H01L 29/423* (2006.01)

(52) U.S. Cl.
CPC .. *H01L 27/10873* (2013.01); *H01L 21/02554* (2013.01); *H01L 21/02565* (2013.01); *H01L 27/10805* (2013.01); *H01L 27/1225* (2013.01); *H01L 29/42384* (2013.01); *H01L 29/7869* (2013.01); *H01L 29/78696* (2013.01)

(58) Field of Classification Search
CPC ........... H01L 27/10823; H01L 27/1225; H01L 29/7869; H01L 29/78696

USPC ............................................ 257/49, E29.273
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |
| 6,040,595 A * | 3/2000 | Yang ............................ 257/300 |

(Continued)

FOREIGN PATENT DOCUMENTS

| EP | 1737044 A | 12/2006 |
| EP | 2226847 A | 9/2010 |

(Continued)

OTHER PUBLICATIONS

Introduction to Microelectronic Fabrication, vol. V. Richard Jaeger. 2002 p. 217 Prentice Hall Inc.*

(Continued)

*Primary Examiner* — Marcos D Pizarro
(74) *Attorney, Agent, or Firm* — Robinson Intellectual Property Law Office; Eric J. Robinson

(57) ABSTRACT

A semiconductor memory device includes a transistor and a capacitor. The transistor includes: an insulating film in which a groove portion is provided; a pair of electrodes separated so that the groove portion is sandwiched therebetween; an oxide semiconductor film which is in contact with the pair of electrodes and side surfaces and a bottom surface of the groove portion and has a thickness value smaller than a depth value of the groove portion; a gate insulating film covering the oxide semiconductor film; and a gate electrode provided to overlap with the oxide semiconductor film with the gate insulating film positioned therebetween.

15 Claims, 13 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,635,526 B1 | 10/2003 | Malik et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,419,858 B2 | 9/2008 | Schuele et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,755,126 B2 | 7/2010 | Kondo |
| 7,795,096 B2 | 9/2010 | Wang |
| 7,846,826 B2 | 12/2010 | Oyu et al. |
| 7,872,309 B2 | 1/2011 | Schuele et al. |
| 8,164,138 B2 | 4/2012 | Lee |
| 8,461,582 B2 | 6/2013 | Kimura |
| 8,492,758 B2 | 7/2013 | Yamazaki et al. |
| 8,759,206 B2 | 6/2014 | Kimura |
| 9,214,563 B2 | 12/2015 | Yamazaki et al. |
| 9,318,617 B2 | 4/2016 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0232408 A1 | 11/2004 | Heeger et al. |
| 2004/0232495 A1* | 11/2004 | Saito et al. ............... 257/382 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0084255 A1 | 4/2006 | Oyu et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1* | 8/2007 | Hirao et al. ............... 257/43 |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0278540 A1 | 12/2007 | Hoshino et al. |
| 2007/0287296 A1 | 12/2007 | Chang |
| 2007/0296031 A1 | 12/2007 | Tanaka |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0057649 A1* | 3/2008 | Schuele et al. ............... 438/270 |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001436 A1 | 1/2009 | Kondo |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0256237 A1 | 10/2009 | Kobayashi |
| 2009/0278122 A1 | 11/2009 | Hosono et al. |
| 2009/0280600 A1 | 11/2009 | Hosono et al. |
| 2009/0315138 A1 | 12/2009 | Chang et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0159369 A1 | 6/2010 | Sakata |
| 2010/0224872 A1* | 9/2010 | Kimura ............... 257/43 |
| 2012/0025304 A1 | 2/2012 | Blank et al. |
| 2012/0187410 A1 | 7/2012 | Yamazaki et al. |
| 2012/0187417 A1* | 7/2012 | Yamazaki et al. ............... 257/77 |
| 2012/0187475 A1 | 7/2012 | Yamazaki et al. |
| 2012/0223306 A1 | 9/2012 | Saito et al. |
| 2012/0235150 A1 | 9/2012 | Isobe et al. |
| 2012/0256179 A1 | 10/2012 | Yamazaki et al. |
| 2014/0291676 A1 | 10/2014 | Kimura |
| 2016/0218226 A1 | 7/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-027492 A | 2/1994 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-060524 A | 3/2008 |
| JP | 2009-016368 A | 1/2009 |
| JP | 2009-152346 A | 7/2009 |
| JP | 2010-040815 A | 2/2010 |

(56) References Cited

FOREIGN PATENT DOCUMENTS

| JP | 2010-232645 A | 10/2010 |
|---|---|---|
| JP | 2011-009393 A | 1/2011 |
| JP | 2012-195574 A | 10/2012 |
| WO | WO-2004/114391 | 12/2004 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letter) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Kim, IEDM 05: Technical Digest of International Electron Devices Meeting, "Technology for sub-50nm DRAM and NAND Flash Manufacturing," pp. 333-336, Dec. 5, 2005.

* cited by examiner apparent channel length effective channel length apparent channel length effective channel length groove portion

SEMICONDUCTOR MEMORY DEVICE INCLUDING MEMORY CELL WHICH INCLUDES TRANSISTOR AND CAPACITOR

BACKGROUND OF THE INVENTION

1. Field of the Invention

The present invention relates to a semiconductor memory device which includes a circuit including a semiconductor element such as a transistor.

2. Description of the Related Art

A dynamic random access memory (DRAM) is a semiconductor memory device where one bit of data can be stored with use of one transistor and one capacitor. The DRAM has advantages such as a small area per unit memory cell, easiness in integration for modularization, and low manufacturing cost.

Circuit patterns for DRAMs, like those for other semiconductor integrated circuits, have been miniaturized in accordance with the scaling law, and there was a time when it was considered difficult to achieve a design rule of 100 nm or less. One of the reasons is that in a transistor having a channel length of 100 nm or less, a leakage current caused by a punch-through phenomenon is likely to flow due to a short-channel effect and the transistor becomes incapable of functioning as a switching element, which has been considered to be a problem. In order to prevent a punch-through current, a silicon wafer may be doped with an impurity at high concentration. However, this is not an appropriate solution to the problem because it makes a junction leakage current likely to flow between a source and a substrate or between a drain and the substrate and eventually causes a deterioration of memory retention characteristics.

Against such a problem, a method has been considered for reducing the area occupied by one memory cell and also maintaining an effective channel length so as not to cause a short-channel effect by forming a transistor in the memory cell in accordance with a shape of a groove portion. One example is a structure in which a U-shaped vertically long groove portion is formed in a region where a channel portion of a transistor is formed, a gate insulating film is formed along a wall surface in the groove portion, and a gate electrode is formed so as to fill the groove (see Non-Patent Document 1).

A transistor having a channel portion of such a structure has a long effective channel length because a current flows between a source region and a drain region via an indirect route across the groove portion. Thus, an effect of reducing the area occupied by a transistor and suppressing a short-channel effect can be obtained.

In the DRAM, charge accumulated in the capacitor leaks due to off-state current of the transistor; therefore, there has been a need for recharging (refreshing) before necessary charge is lost.

REFERENCE

[Non-Patent Document]

[Non-Patent Document 1] Kinam Kim, "Technology for sub-50 nm DRAM and NAND Flash Manufacturing", International Electron Devices Meeting 2005, IEDM Technical Digest, December 2005, pp. 333-336

SUMMARY OF THE INVENTION

A conventional DRAM needs to be refreshed at an interval of several tens of milliseconds to hold data, which results in large power consumption. In addition, a transistor therein is frequently turned on and off; thus, deterioration of the transistor is also a problem. These problems become significant as the memory capacity increases and transistor miniaturization advances.

Thus, an object is to provide a semiconductor memory device with low power consumption in which the number of refresh operation for holding data is decreased.

Another object is to provide a semiconductor memory device in which the influence caused by a short-channel effect is reduced even when the integration degree is increased and which is manufactured with the reduced number of photolithography steps as compared with that of steps for manufacturing a conventional device.

One embodiment of the present invention is a semiconductor memory device including a transistor and a capacitor. The transistor includes: an insulating film in which a groove portion is provided; a pair of electrodes which is separated so that the groove portion is sandwiched therebetween; an oxide semiconductor film which has a thickness value smaller than a depth value of the groove portion and is in contact with the pair of electrodes and a bottom surface and side surfaces of the groove portion; a gate insulating film covering the oxide semiconductor film; and a gate electrode provided to overlap with the oxide semiconductor film with the gate insulating film positioned therebetween. The capacitor includes a first capacitor electrode which is connected to one of the pair of electrodes and is formed using the same material and in the same layer as the pair of electrodes, a dielectric film formed using the same material and in the same layer as the gate insulating film, and a second capacitor electrode which is formed using the same material and in the same layer as the gate electrode and overlaps with the first capacitor electrode with the dielectric film positioned therebetween.

In this specification, the sentence "the first film is formed using the same material and in the same layer as the second film" may include all cases where a film extended from the first film is the second film and where the first film and the second film are separated.

The oxide semiconductor film forming a channel formation region in the transistor has a shape along the groove portion, whereby the effective channel length can be longer than a distance between the pair of electrodes, which is an apparent channel length seen from a top surface. Thus, even in the case where the size of the transistor is reduced, the influence caused by the short-channel effect can be reduced.

One embodiment of the present invention is a semiconductor memory device including a transistor and a capacitor, and the transistor includes an insulating film, a pair of electrodes which is provided over the insulating film and substantially aligned with the insulating film as viewed from above, an oxide semiconductor film in contact with the pair of electrodes, a gate insulating film covering the oxide semiconductor film, and a gate electrode overlapping with the oxide semiconductor film with the gate insulating film positioned therebetween.

In this specification, the sentence "one film is substantially aligned with another film as viewed from above" means that outlines of the side surfaces of the one film and another film viewed from above are substantially aligned, including the case where an upper end portion of one film and a lower end portion of another film are aligned, the case where the side surface of one film is recessed with respect to the side surface of another film, and the case where tapered shapes of the side surfaces on one side of the films are different from one another.

The transistor has a structure in which the pair of electrodes and the insulating film are substantially aligned with each other as viewed from above and the oxide semiconductor film forming a channel region is in contact with the pair of electrodes and side surfaces of the insulating film. With such a structure, the effective channel length can be longer than a distance between the pair of electrodes viewed from above, which is an apparent channel length, and thus, the influence caused by the short-channel effect can be reduced even in the case where the size of the transistor is reduced.

The pair of electrodes and the insulating film can be processed with use of the same mask. Alternatively, the insulating film can be processed with use of the pair of electrodes as a mask. Thus, the number of steps in photolithography can be prevented from being increased.

One embodiment of the present invention is a semiconductor memory device in which a capacitor is formed in accordance with a shape of a groove portion.

In order to form a capacitor to have a shape along the groove portion, a groove portion similar to the groove portion formed in a region where the transistor is formed may also be formed in a region where the capacitor is formed. Both of the groove portions can be formed in the same process.

When the capacitor is formed to have a shape along the groove portion, the degree of integration of the semiconductor memory device can be further increased.

Note that when an oxide semiconductor film is used for the channel region in the transistor, the off-state current of the transistor can be reduced. Here, the off-state current refers to a current corresponding to electric charge moving between a source electrode and a drain electrode in a state where no voltage is applied between a gate electrode and the source electrode in the transistor.

For the oxide semiconductor film, a material having a band gap of 2.5 eV or more, preferably 3.0 eV or more may be selected. With use of a material with a band gap in the above range, the off-state current of the transistor can be reduced. Note that in one embodiment of the present invention, another material having semiconductor characteristics and a band gap in the above range may be applied.

It is preferable that the oxide semiconductor film be highly purified so as to contain as little impurities (such as hydrogen, an alkali metal, an alkaline earth metal, a rare gas, nitrogen, phosphorus, or boron) causing carriers directly or indirectly as possible. Furthermore, it is preferable to reduce oxygen vacancy as much as possible. By reducing impurities and oxygen vacancy in the oxide semiconductor film, generation of carriers in the oxide semiconductor film is suppressed, and the off-state current of the transistor can be reduced.

As described above, with the transistor with small off-state current, retention characteristic of charge accumulated in a capacitor in a DRAM can be improved. As a result, frequency of refresh operation and the area of the capacitor can be reduced.

A semiconductor memory device in which power consumption is lowered by decreasing the number of refresh operation for holding data is provided.

A semiconductor memory device in which with a channel region formed in accordance with a shape of a groove portion in a transistor, the influence caused by the short-channel effect is reduced even when the integration degree is increased is provided. In manufacturing such a semiconductor memory device, the number of steps in photolithography is smaller than that of photolithography needed for manufacturing a conventional device.

DETAILED DESCRIPTION OF THE INVENTION

Figure 1A:
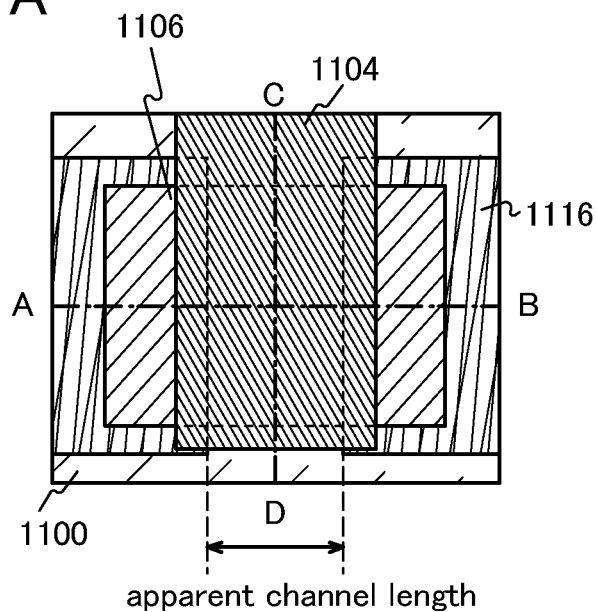
FIGS. 1A to 1C are a top view and cross-sectional views illustrating an example of a semiconductor memory device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

Note that voltage refers to a potential difference between a predetermined potential and a reference potential (e.g., a ground potential) in many cases. Accordingly, voltage, potential and a potential difference can be referred to as potential, voltage, and a voltage difference, respectively.

Even when the expression "to be connected" is used in this specification, there is a case in which no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the present invention.

Note that in this specification, in referring to a specific row, a specific column, or a specific position in a matrix, a reference sign is accompanied by a sign denoting coordinates as follows, for example: "a transistor Tr_n_m", or "a bit line BL_m". In the case where a row, a column, or a position is not specified, the case where elements are collectively referred to, or the case where the position is obvious, the following expressions may be used: "a transistor Tr1" and "a bit line BL", or simply "a transistor" and "a bit line".

Embodiment 1

In this embodiment, a transistor included in a semiconductor memory device according to one embodiment of the present invention will be described.

Figure 1B:
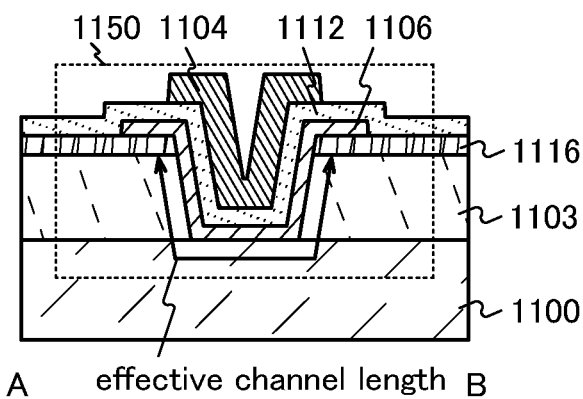
Figure 1C:
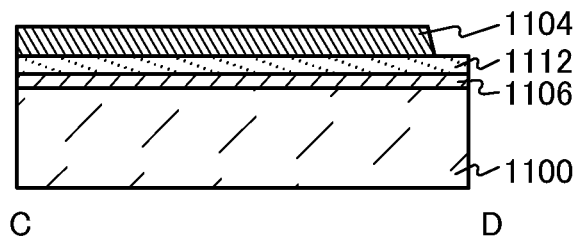

FIG. 1A is a top view of a transistor 1150. FIG. 1B illustrates a cross section A-B along dashed-dotted line A-B in FIG. 1A, and FIG. 1C illustrates a cross section C-D along dashed-dotted line C-D in FIG. 1A.

The transistor 1150 includes: a pair of electrodes 1116 over a substrate 1100 having an insulating surface; an insulating film 1103 which is below the pair of electrodes 1116 and substantially aligned with the pair of electrodes 1116 as viewed from above; an oxide semiconductor film 1106 in contact with the pair of electrodes 1116, side surfaces of the insulating film 1103, and a surface of the substrate 1100; a gate insulating film 1112 covering the oxide semiconductor film 1106; and a gate electrode 1104 provided over the oxide semiconductor film 1106 with the gate insulating film 1112 positioned therebetween.

Note that the insulating film 1103 is not necessarily formed to have a structure where the substrate 1100 is exposed as long as side surfaces of a groove portion formed in the insulating film 1103 are substantially aligned with side surfaces of the pair of electrodes 1116 as viewed from above (that is, the side surfaces of the groove portion formed in the insulating film 1103 are coextensive with side surfaces of the pair of electrodes 1116). In other words, the oxide semiconductor film 1106 is not necessarily in contact with the surface of the substrate 1100. For example, the oxide semiconductor film 1106 may be in contact with side surfaces and a bottom surface of the groove portion formed in the insulating film 1103.

In the transistor 1150, by formation of the groove portion in the insulating film 1103, the length of a channel region formed in the oxide semiconductor film 1106 (the effective channel length, see FIG. 1B) can be longer than an apparent channel length that is a distance between the pair of electrodes 1116 viewed from above (see FIG. 1A). For example, the thickness of the insulating film 1103 is adjusted so that the value of the thickness of the insulating film 1103 can be larger than the value of the distance between the pair of electrodes 1116 viewed from above, whereby the effective channel length can be three times or more the apparent channel length. In order to make the effective channel length longer than the apparent channel length, it is at least necessary that the oxide semiconductor film 1106 is provided to have a smaller thickness than the insulating film 1103.

For example, the apparent channel length is greater than or equal to 15 nm and less than or equal to 100 nm. In that case, the depth of the groove portion formed in the insulating film 1103 is preferably greater than or equal to 7.5 nm and less than or equal to 200 nm.

There is no particular limitation on properties of a material and the like of the substrate 1100 as long as the material has heat resistance high enough to withstand at least heat treatment to be performed later. For example, a glass substrate, a ceramic substrate, a quartz substrate, a sapphire substrate, or the like may be used as the substrate 1100. Further alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used. Still further alternatively, any of these substrates provided with a semiconductor element may be used as the substrate 1100.

Further, a flexible substrate may be used as the substrate 1100. In that case, a transistor is formed directly on the flexible substrate. Note that as a method for providing a transistor on a flexible substrate, there is a method in which the transistor formed over a non-flexible substrate is separated from the non-flexible substrate and transferred on a flexible substrate. In that case, a separation layer is preferably provided between the non-flexible substrate and the transistor.

The gate electrode 1104 may be formed to have a single-layer structure or a stacked-layer structure using one or more of the following materials: Al, Ti, Cr, Co, Ni, Cu, Y, Zr, Mo, Ag, Ta, and W, a nitride of any of these elements, an oxide of any of these elements, and an alloy of any of these elements. In the case of using an oxide for the gate electrode 1104, nitrogen may be contained at higher than or equal to $5 \times 10^{19}$ cm$^{-3}$ and lower than or equal to 20 at. %, preferably, higher than or equal to $1 \times 10^{20}$ cm$^{-3}$ and lower than or equal to 7 at. %. For example, an oxide film which contains nitrogen at higher than or equal to $1 \times 10^{20}$ cm$^{-3}$ and lower than or equal to 7 at. % and also contains In, Ga, and Zn is used. Since an oxide film has higher resistance than a metal film, in the case of using an oxide film for the gate electrode 1104, it is preferable to use a stacked-layer structure of the oxide film and a low-resistance film having a sheet resistance of lower than or equal to 10 Ω/sq in order to reduce the total resistance of the gate electrode. The concentration expressed in a unit "cm$^{-3}$" can be quantified by SIMS (secondary ion mass spectrometry) analysis, and the concentration expressed in a unit "at. %" can be quantified by XPS (X-ray photoelectron spectroscopy) analysis.

For formation of the oxide semiconductor film 1106, a sputtering method, a plasma CVD method, a pulse laser deposition (PLD) method, a molecular beam epitaxy (MBE) method, an evaporation method, or the like may be employed, and for example a material containing two or more of In, Ga, Zn, and Sn may be used.

For example, for the oxide semiconductor film 1106, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. Here, for example, an In—Ga—Zn—O-based material means oxide containing indium (In), gallium (Ga), and zinc (Zn), and there is no particular limitation on the composition ratio. Further, the In—Ga—Zn—O-based oxide semiconductor may contain an element other than In, Ga, and Zn. In this case, the oxide semiconductor film 1106 preferably contains a larger amount of oxygen than the stoichiometric amount of oxygen. When the amount of oxygen is in excess of stoichiometry, generation of carriers which results from oxygen vacancy in the oxide semiconductor film 1106 can be suppressed.

For example, in the case where an In—Zn—O-based material is used for the oxide semiconductor film 1106, the atomic ratio of In to Zn is higher than or equal to 0.5 and lower than or equal to 50, preferably higher than or equal to 1 and lower than or equal to 20, further preferably higher than or equal to 1.5 and lower than or equal to 15. When the atomic ratio of In to Zn is in the above range, the field effect mobility of the transistor can be improved. Here, when the atomic ratio of the compound is In:Zn:O=X:Y:Z, the relation, Z>1.5X+Y is preferably satisfied.

Further, a material represented by $InMO_3(ZnO)_m$ (m>0) may be used for the oxide semiconductor film 1106. Here, M represents one or more metal elements selected from Ga, Al, Mn, and Co. For example, M may be Ga, Ga and Al, Ga and Mn, Ga and Co, or the like.

As a material of the oxide semiconductor film 1106, a material with a band gap of 2.5 eV or more, preferably 3.0 eV or more, is selected in order to reduce the off-state current of the transistor. However, a material having semiconductor characteristics and a band gap in the above range may be used instead of the oxide semiconductor film.

In the oxide semiconductor film 1106, hydrogen, an alkali metal, an alkaline earth metal, and the like are reduced and the concentration of impurities is very low. Therefore, in the transistor whose channel region is formed using the oxide semiconductor film 1106, the off-state current can be reduced.

The concentration of hydrogen in the oxide semiconductor film 1106 is lower than $5\times10^{18}$ cm$^{-3}$, preferably lower than or equal to $1\times10^{18}$ cm$^{-3}$, further preferably lower than or equal to $5\times10^{17}$ cm$^{-3}$, still further preferably, lower than or equal to $1\times10^{16}$ cm$^{-3}$.

An alkali metal is not an element forming an oxide semiconductor, and therefore, is an impurity. Also, an alkaline earth metal is an impurity in the case where an alkaline earth metal is not an element forming an oxide semiconductor. In particular, when an insulating film in contact with the oxide semiconductor film is an oxide, sodium (Na), among alkali metals, is diffused into the insulating film and becomes Na$^+$. In addition, in the oxide semiconductor film, Na cuts or enters a bond between metal and oxygen which are included in an oxide semiconductor. As a result, for example, deterioration of characteristics of the transistor such as shift of a threshold voltage in the negative direction to lead to a normally-on state transistor or a reduction in field-effect mobility occurs; in addition, variation in characteristics is also caused. Such deterioration of characteristics of the transistor and variation in characteristics due to the impurity frequently appear when the concentration of hydrogen in the oxide semiconductor film is sufficiently low. Therefore, when the hydrogen concentration in the oxide semiconductor film is lower than or equal to $1\times10^{18}$ cm$^{-3}$, preferably lower than or equal to $1\times10^{17}$ cm$^{-3}$, the concentration of the above impurity is preferably reduced. Specifically, the measurement value of the Na concentration is preferably lower than or equal to $5\times10^{16}$ cm$^{-3}$, further preferably lower than or equal to $1\times10^{16}$ cm$^{-3}$, still further preferably lower than or equal to $1\times10^{15}$ cm$^{-3}$. In addition, the lithium (Li) concentration is preferably lower than or equal to $5\times10^{15}$ cm$^{-3}$, further preferably lower than or equal to $1\times10^{15}$ cm$^{-3}$. In addition, the potassium (K) concentration is preferably lower than or equal to $5\times10^{15}$ cm$^{-3}$, further preferably lower than or equal to $1\times10^{15}$ cm$^{-3}$.

When a channel region of the transistor is formed using the above-described oxide semiconductor film 1106, the off-state current of the transistor can be reduced.

The oxide semiconductor film 1106 is in a single crystal state, a polycrystalline (also referred to as polycrystal) state, an amorphous state, or the like.

The oxide semiconductor film 1106 is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

The insulating film 1103 and the gate insulating film 1112 may be, for example, formed with a stacked layer or a single layer using one or more of silicon oxide, silicon oxynitride, silicon nitride oxide, silicon nitride, aluminum oxide, hafnium oxide, yttrium oxide, zirconium oxide, and the like. For example, the insulating film 1103 and the gate insulating film 1112 may be formed by a thermal oxidation method, a plasma CVD method, a sputtering method, or the like.

The insulating film 1103 and the gate insulating film 1112 are each preferably a film from which oxygen is released by heat treatment. With use of such a film from which oxygen is released by heat treatment, defects generated in the oxide semiconductor film 1106 and in the vicinity of the interface of the oxide semiconductor film 1106 can be repaired and deterioration in electric characteristics of the transistor can be suppressed.

To release oxygen by heat treatment means that the released amount of oxygen which is converted to oxygen atoms is greater than or equal to $1.0 \times 10^{18}$ cm$^{-3}$, preferably greater than or equal to $3.0 \times 10^{20}$ cm$^{-3}$ in thermal desorption spectroscopy (TDS).

Here, a method in which the amount of released oxygen is measured by being converted into oxygen atoms using TDS analysis will now be described.

The amount of released gas in TDS analysis is proportional to the integral value of a spectrum. Therefore, the amount of released gas can be calculated from the ratio between the integral value of a spectrum obtained by measurement and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be found according to a Numerical Expression 1 with the TDS analysis results of a silicon wafer containing hydrogen at a predetermined density which is the standard sample and the TDS analysis results of the insulating film. Here, all spectra in a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2} \times S_{O2} \times \alpha \qquad \text{(Numerical Expression 1)}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of the Numerical Expression 1. Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, part of released oxygen is detected as oxygen atoms. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heat treatment may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the insulating film 1103 and the gate insulating film 1112 to the oxide semiconductor film 1106, the interface state density at the interface between the oxide semiconductor film 1106 and the insulating film 1103 or the interface state density at the interface between the oxide semiconductor film 1106 and the gate insulating film 1112 can be reduced. As a result, carrier trapping occurring due to an operation of the transistor or the like at the interface between the oxide semiconductor film 1106 and the insulating film 1103 or the interface between the oxide semiconductor film 1106 and the gate insulating film 1112 can be suppressed, and thus, a transistor with less deterioration in electric characteristics can be obtained.

Further, in some cases, charge is generated due to oxygen vacancy in the oxide semiconductor film 1106. In general, part of oxygen vacancy in an oxide semiconductor film serves as a donor and causes release of an electron which serves as a carrier. As a result, the threshold voltage of a transistor shifts in the negative direction. When oxygen is sufficiently supplied from the insulating film 1103 and the gate insulating film 1112 to the oxide semiconductor film 1106, oxygen vacancy in the oxide semiconductor film which causes the negative shift of the threshold voltage can be reduced.

The pair of electrodes 1116 may be formed with a single-layer structure or a stacked-layer structure using a metal film, a metal nitride film, a metal oxide film, an alloy film, or the like given for the gate electrode 1104.

In the transistor 1150 formed in the above manner, with use of the oxide semiconductor film 1106, the off-state current can be reduced to be less than or equal to $1\times10^{-18}$ A, preferably less than or equal to $1\times10^{-21}$ A, further preferably, less than or equal to $1\times10^{-24}$ A. As a result, in a semiconductor memory device, electric charge accumulated in the capacitor can be hold for a long time, and the frequency of refresh operations can be reduced accordingly. Therefore, the power consumption of the semiconductor memory device can be lowered. In addition, since low frequency of operation of the transistor 1150 brings less deterioration in electric characteristics of the transistor 1150, a highly reliable semiconductor memory device can be provided.

An example of a method for manufacturing the transistor 1150 described in this embodiment is described with reference to FIGS. 13A to 13D.

First, an insulating film 1183 is formed over the substrate 1100. Then, a conductive film 1184 is formed (see FIG. 13A). Note that the insulating film 1183 and the conductive film 1184 may be successively formed without being exposed to air. In such a manner, cleanliness of each interface of layers is improved and entry of impurities (such as hydrogen, an alkali metal, an alkaline earth metal, nitrogen, phosphorus, or boron) can be inhibited, which is preferable.

Next, a resist mask is formed over the conductive film 1184 with a photolithography process or the like. With use of the resist mask, the conductive film 1184 and the insulating film 1183 are processed to form the pair of electrodes 1116 and the insulating film 1103 which are substantially aligned with each other as viewed from above (see FIG. 13B). In this process, the conductive film 1184 and the insulating film 1183 may be processed with use of the same resist mask to form the pair of electrodes 1116 and the insulating film 1103. Alternatively, the pair of electrodes 1116 may be formed first with use of a resist mask, then the resist mask is removed, and the insulating film 1183 may be processed with use of the pair of electrodes 1116 as a mask to from the insulating film 1103. As described above, the pair of electrodes 1116 and the insulating film 1103 are substantially aligned with each other as viewed from above, whereby the number of steps in photolithography or the number of photomasks needed for the photolithography can be reduced.

Figure 13A:
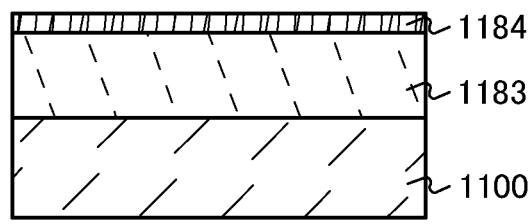
FIGS. 13A to 13D are cross-sectional views illustrating an example of a method for manufacturing a semiconductor memory device according to one embodiment of the present invention.
Figure 13B:
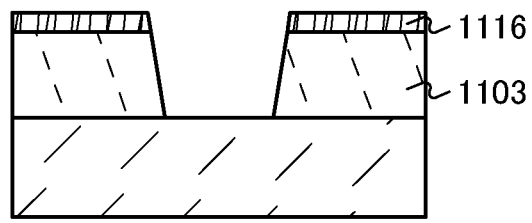
Figure 13C:
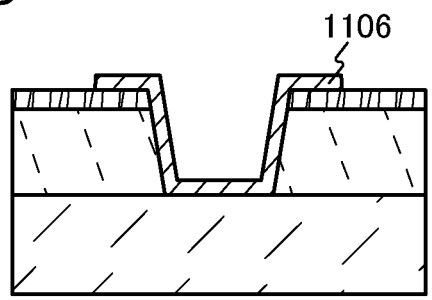
Figure 13D:
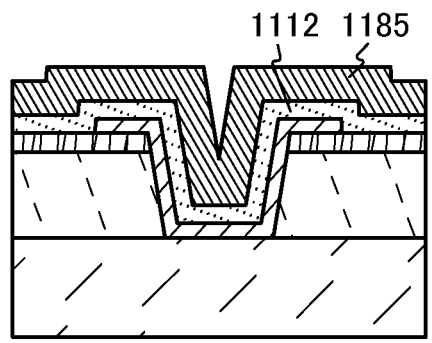

Next, the oxide semiconductor film 1106 which is in contact with the pair of electrodes 1116, side surfaces of the insulating film 1103, and a surface of the substrate 1100 is formed (FIG. 13C). For formation of the oxide semiconductor film 1106, an oxide semiconductor film that is to be the oxide semiconductor film 1106 may be formed and then heat treatment may be performed. The heat treatment is performed at from 150° C. to 650° C. inclusive, preferably at from 250° C. to 450° C. inclusive. By the heat treatment, oxygen is released from the insulating film 1103, so that defects in the oxide semiconductor film and in the vicinity of the interface of the oxide semiconductor film can be reduced. In this case, after heat treatment, the oxide semiconductor film may be processed to form the oxide semiconductor film 1106. Further, a treatment for reducing resistance may be performed on part of the oxide semiconductor film 1106 by an ion implantation method or an ion doping method. A region where resistance is reduced can be a lightly doped drain (LDD) region. When the LDD region is provided, deterioration of the transistor, caused by hot carriers or the like, can be suppressed, and thus, a highly reliable transistor can be manufactured.

Next, the gate insulating film 1112 is formed. Then, a conductive film 1185 is formed (see FIG. 13D). Note that heat treatment may be performed after the gate insulating film 1112 is formed. The heat treatment is performed at from 150° C. to 650° C. inclusive, preferably at from 250° C. to 450° C. inclusive. By the heat treatment, oxygen is released from the gate insulating film 1112, so that defects in the oxide semiconductor film 1106 and in the vicinity of the interface of the oxide semiconductor film 1106 can be reduced. The timing for performing this heat treatment is not limited to the timing just after formation of the gate insulating film 1112. This heat treatment may be performed just after formation of the conductive film 1185 or after any of steps performed after formation of the gate insulating film 1112.

Next, the conductive film 1185 is processed to form the gate electrode 1104 overlapping with the oxide semiconductor film 1106. Through the above-described steps, the transistor 1150 illustrated in FIGS. 1A to 1C can be manufactured.

As described above, the pair of electrodes 1116 and the insulating film 1103 are aligned with each other as viewed from above, and such a structure enables both the pair of electrodes 1116 and the insulating film 1103 to be processed with use of the same mask or enables the insulating film 1103 to be processed with use of the pair of electrodes 1116 as a mask. As a result, the number of steps in photolithography or the number of photomasks needed for the photolithography can be reduced.

Note that plasma treatment such as a reverse sputtering treatment may be performed on the pair of electrodes 1116. When such a treatment is performed, the upper end portions of the pair of electrodes 1116 can be rounded to have curved surfaces, and thus the coverage with the oxide semiconductor film 1106 and the gate insulating film 1112 formed thereover can be improved. Alternatively, at the same time of processing the insulating film 1183 with use of the pair of electrodes 1116 as a mask to form the insulating film 1103, the upper end portions of the pair of electrodes 1116 may be rounded to have curved surfaces.

According to this embodiment, a semiconductor memory device in which with a channel region formed in accordance with a shape of a groove portion in a transistor, the influence caused by the short-channel effect is reduced even when the integration degree is increased is provided. In manufacture of such a semiconductor memory device, the number of steps in photolithography is smaller than that of photolithography needed for manufacturing a conventional device.

This embodiment can be implemented in appropriate combination with the other embodiments.

Embodiment 2

In this embodiment, a circuit configuration of a DRAM that is a semiconductor memory device to which one embodiment of the present invention is applied will be described, and structures of a transistor and a capacitor included in the DRAM will also be described.

Figure 6:
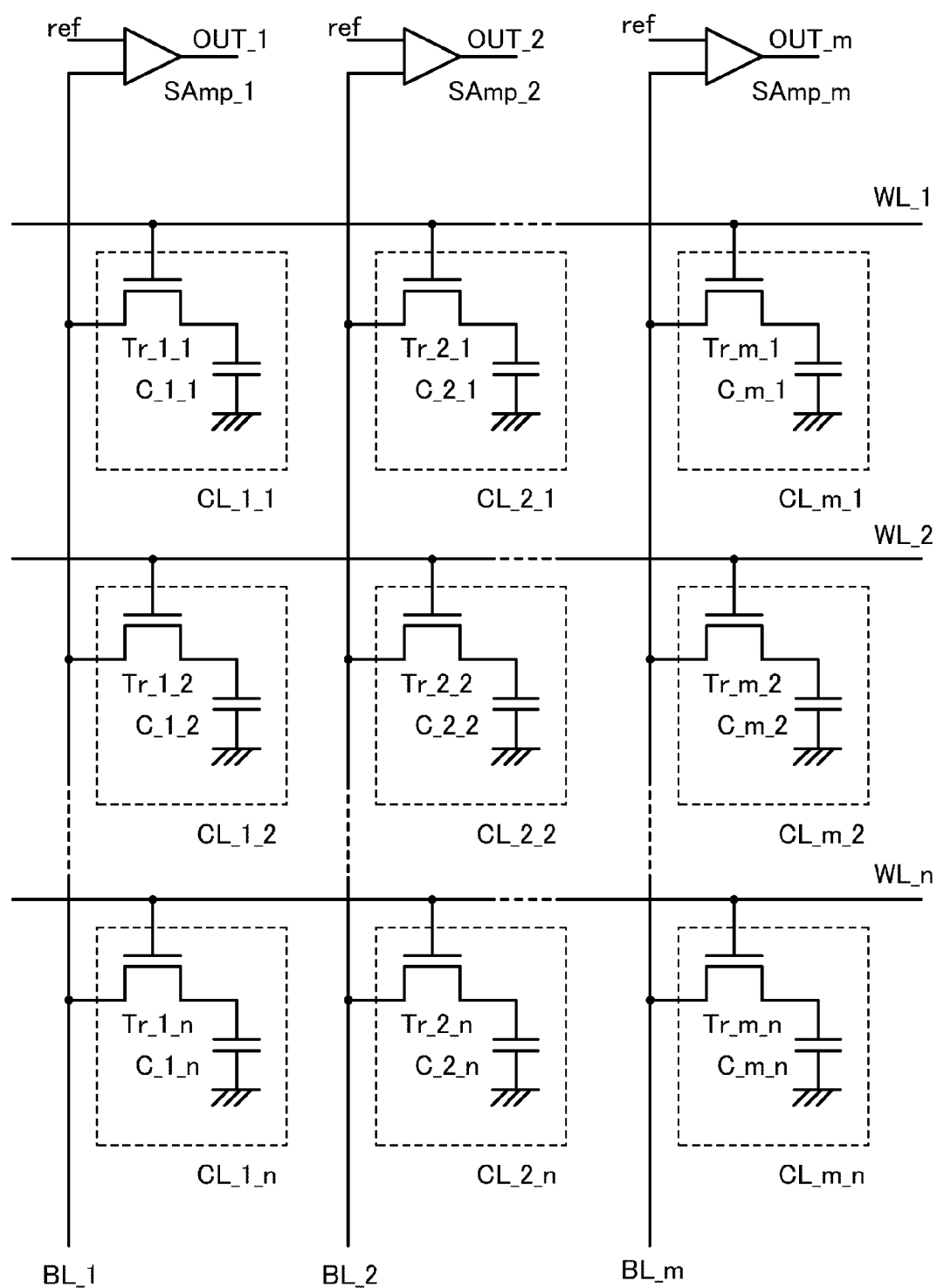
FIG. 6 is a circuit diagram showing an example of a semiconductor memory device according to one embodiment of the present invention.

FIG. 6 illustrates a memory cell array including a plurality of memory cells arranged in a matrix including n rows and m columns, to which DRAMs are applied. Each memory cell includes one transistor and one capacitor. Bit lines and word lines are connected to the memory cells. Of each transistor, one of a source electrode and a drain electrode is connected to the bit line, and a gate electrode is connected to the word line. Further, the other of the source electrode and the drain electrode of the transistor is connected to one of electrodes in the capacitor. The other electrode in the capacitor is connected to the ground (GND). The bit lines are also connected to sense amplifiers.

Figure 7A:
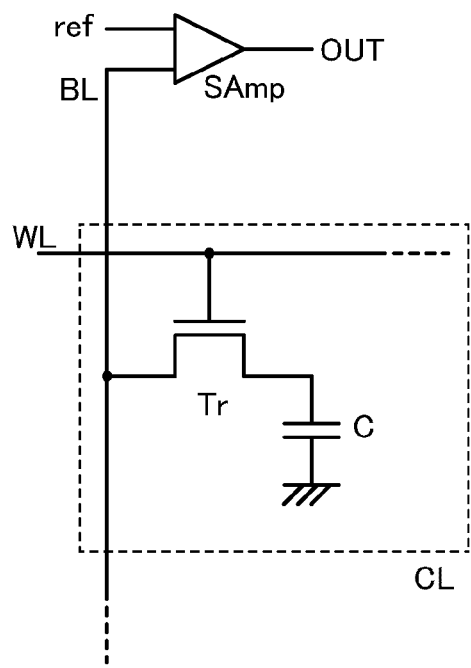
FIG. 7A is a circuit diagram showing an example of a semiconductor memory device according to one embodiment of the present invention and FIG. 7B shows electrical characteristics thereof.

FIG. 7A illustrates an example of one of memory cells CL included in the memory cell array. One memory cell CL includes one transistor Tr and one capacitor C. When data 1 is written, a bit line BL is set at a predetermined potential VDD (a potential ample to charge the capacitor), and VH is applied to a word line WL. In this specification, VH is higher than a voltage obtained by adding VDD to the threshold voltage ($V_{th}$) of the transistor Tr.

Figure 7B:
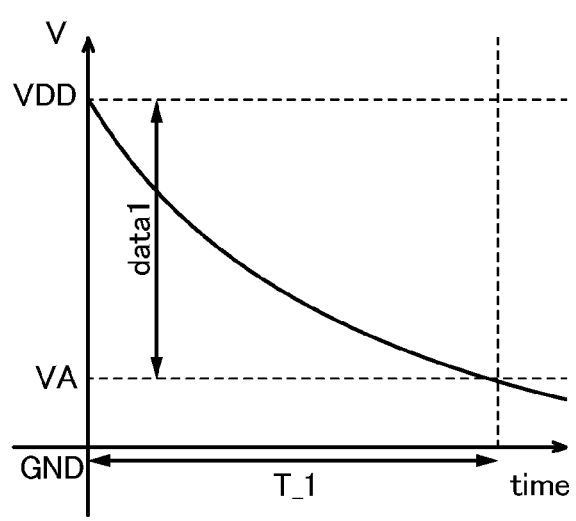

By the above operation, electric charge corresponding to the potential VDD can be accumulated in the capacitor C. The electric charge accumulated in the capacitor C is gradually released due to the off-state current of the transistor Tr and then at a time T_1, reaches a potential VA at which the readout operation cannot be performed (see FIG. 7B). Thus, data needs to be rewritten by performing refresh operation before the time T_1 comes.

Thus, in order to reduce the number of refresh operations, the off-state current of the transistor Tr needs to be reduced. In order to reduce the off-state current of the transistor Tr, a channel region of the transistor Tr may be formed using an oxide semiconductor film. The details of the oxide semiconductor film are described later.

For reading data of the memory cell CL, the potential of the bit line BL is set at an appropriate potential, e.g., VR, first. Next, the potential of the word line WL is set at VH, so that the potential of the bit line BL is changed in accordance with the held potential. Such a potential can be read out from an output OUT through a sense amplifier SAmp.

Through the above operations, writing and reading data to/from the memory cell CL can be performed.

With use of FIG. 6, methods for writing and reading data to/from a memory cell array including n rows and m columns are described.

Data writing may be performed on every memory cell. For example, when data are written into the memory cell CL_a_b (a is a natural number less than or equal to m, and b is a natural number less than or equal to n), the potential of the bit line BL_b is set at the potential VDD, and VH is applied to the word line WL_a. In this manner, data can be written into the memory cell CL_a_b. This operation is performed on every memory cell, whereby data can be written to all memory cells.

Data reading may be performed on every memory cell. For example, when data at the memory cell CL_a_b is read, the bit line BL_b is set at the potential VR. Then, when the word line WL_a is set at VH, the potential of the bit line BL_b is changed in accordance with data. This potential is read from the output OUT_a through the sense amplifier SAmp_a. This step is performed on every memory cell, so that data of the memory cell array including n rows and m columns, having memory cells on the a-th row and the b-th column, can be read.

Next, the transistor Tr and the capacitor C included in the memory cell CL are described with reference to FIGS. 2A to 2C.

Figure 2A:
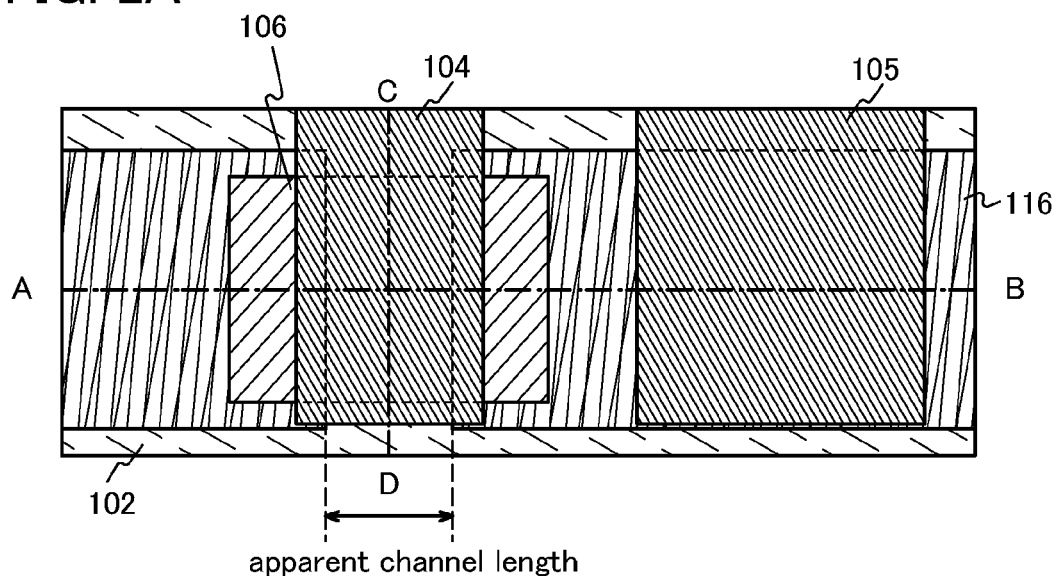
FIGS. 2A to 2C are a top view and cross-sectional views illustrating an example of a semiconductor memory device according to one embodiment of the present invention.
Figure 2B:
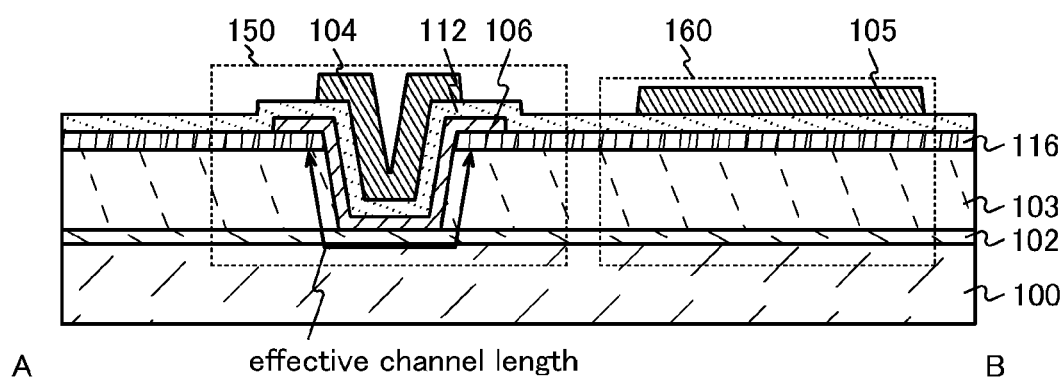
Figure 2C:
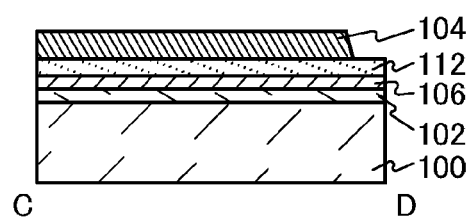

FIGS. 2A to 2C are a top view and cross-sectional views illustrating a transistor 150 and a capacitor 160 which respectively correspond to the transistor Tr and the capacitor C included in the memory cell CL. FIG. 2B illustrates a cross section A-B along dashed-dotted line A-B in FIG. 2A, and FIG. 2C illustrates a cross-section C-D along dashed-dotted line C-D in FIG. 2A.

The semiconductor memory device includes the transistor 150 and the capacitor 160 over a substrate 100. The transistor 150 includes: a base insulating film 102 over the substrate 100; an insulating film 103 over the base insulating film 102; a pair of electrodes 116 which is over the insulating film 103 and substantially aligned with the insulating film 103 as viewed from above; an oxide semiconductor film 106 which is in contact with the pair of electrodes 116 and side surfaces and a bottom surface of a groove portion formed in the insulating film 103; a gate insulating film 112 covering the oxide semiconductor film 106 and the pair of electrodes 116; and a gate electrode 104 overlapping with the oxide semiconductor film 106 with the gate insulating film 112 positioned therebetween. The capacitor 160 includes: a dielectric film which is formed using the same material and in the same layer as the gate insulating film 112; a first capacitor electrode which is formed using the same material and in the same layer as the pair of electrodes 116 and connected to one of the pair of electrodes 116; and a second capacitor electrode 105 which is formed using the same material and in the same layer as the gate electrode 104 and overlaps with the first capacitor electrode with the dielectric film positioned therebetween.

In the transistor 150, by formation of the groove portion in the insulating film 103, the length of a channel region formed in the oxide semiconductor film 106 (the effective channel length, see FIG. 2B) can be longer than an apparent channel length that is a distance between the pair of electrodes 116 viewed from above (see FIG. 2A). For example, the thickness of the insulating film 103 is adjusted so that the value of the thickness of the insulating film 103 can be larger than the value of the distance between the pair of electrodes 116 viewed from above, whereby the effective channel length can be three times or more the apparent channel length. In order to make the effective channel length longer than the apparent channel length, it is at least necessary that the oxide semiconductor film 106 is provided to have a thickness whose value is smaller than that of the depth of the groove portion formed in the insulating film 103.

Here the substrate 100, the insulating film 103, the pair of electrodes 116, the oxide semiconductor film 106, the gate insulating film 112, and the gate electrode 104 correspond to the substrate 1100, the insulating film 1103, the pair of electrodes 1116, the oxide semiconductor film 1106, the gate insulating film 1112, and the gate electrode 1104, respectively.

The base insulating film 102 may have a structure similar to those of the gate insulating film 112 and the insulating film 103.

The base insulating film 102 serves as an etch stop film in processing the insulating film 103. Thus, preferable materials for the base insulating film 102 and the insulating film 103 are such that etching selectivity of the insulating film 103 to the base insulating film 102 is high. For example, a silicon oxide film may be used as the base insulating film 102, and a silicon nitride film may be used as the insulating film 103.

By supplying oxygen from the base insulating film 102 to the oxide semiconductor film 106, the number of the interface states between the oxide semiconductor film 106 and the base insulating film 102 can be reduced. As a result, carrier trapping, occurring due to an operation of the transistor or the like, at the interface between the oxide semiconductor film 106 and the base insulating film 102 can be suppressed, and thus, a transistor with less deterioration in electric characteristics can be obtained.

Further, electric charge is generated owing to oxygen vacancy in the oxide semiconductor film 106 in some cases. When oxygen is sufficiently supplied from the base insulating film 102 to the oxide semiconductor film 106, oxygen vacancy in the oxide semiconductor film which causes the negative shift of the threshold voltage can be reduced.

In the transistor 150 formed to have the above structure, with use of the oxide semiconductor film 106, the off-state current can be reduced to be less than or equal to $1 \times 10^{-18}$ A, preferably less than or equal to $1 \times 10^{-21}$ A, further preferably, less than or equal to $1 \times 10^{-24}$ A. As a result, in a semiconductor memory device, electric charge accumulated in the capacitor 160 can be hold for a long time, and the frequency of refresh operations can be reduced accordingly. Therefore, the power consumption of the semiconductor memory device can be lowered. In addition, since low frequency of operation of the transistor 150 brings less deterioration in electric characteristics of the transistor 150, a highly reliable semiconductor memory device can be provided.

Furthermore, the oxide semiconductor film 106 in contact with the side surfaces and bottom surface of the groove portion formed in the insulating film 103 is formed, whereby the effective channel length can be three times or more, preferably five times or more, further preferably ten times or more the apparent channel length that is a distance between the pair of electrodes 116 viewed from above. Thus, even if the transistor 150 is downsized, the influence caused by the short-channel effect can be reduced, and the integration degree of the semiconductor memory device can be increased.

An example of a manufacturing method of the transistor 150 and the capacitor 160 described in this embodiment is described with reference to FIGS. 8A to 8D.

First, the base insulating film 102 is formed over the substrate 100. Then, an insulating film 183 is formed. Then, a conductive film 184 is formed (see FIG. 8A). Note that the base insulating film 102, the insulating film 183, and the conductive film 184 may be successively formed without being exposed to the air. Such film formation method is preferable because the cleanliness of each interface of the layers can be improved and entry of impurities (such as hydrogen, an alkali metal, an alkaline earth metal, nitrogen, phosphorus, or boron) can be inhibited.

Next, a resist mask is formed over the conductive film 184 with a photolithography process or the like. With use of the resist mask, the conductive film 184 and the insulating film 183 are processed to form the pair of electrodes 116 and the insulating film 103 which are substantially aligned with each other as viewed from above (see FIG. 8B). In this process, the conductive film 184 and the insulating film 183 may be processed with use of the same resist mask, so that the pair of electrodes 116 and the insulating film 103 are formed. Alternatively, the pair of electrodes 116 may be formed first with use of a resist mask, then the resist mask is removed, and the insulating film 183 may be processed with use of the pair of electrodes 116 as a mask, so that the insulating film 103 is formed. As described above, the pair of electrodes 116 and the insulating film 103 are substantially aligned with each other as viewed from above, whereby the number of steps in photolithography or the number of photomasks needed for the photolithography can be reduced.

Figure 8A:
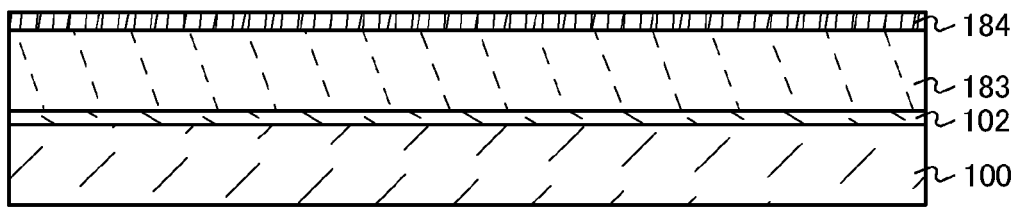
FIGS. 8A to 8D are cross-sectional views illustrating an example of a method for manufacturing a semiconductor memory device according to one embodiment of the present invention.
Figure 8B:
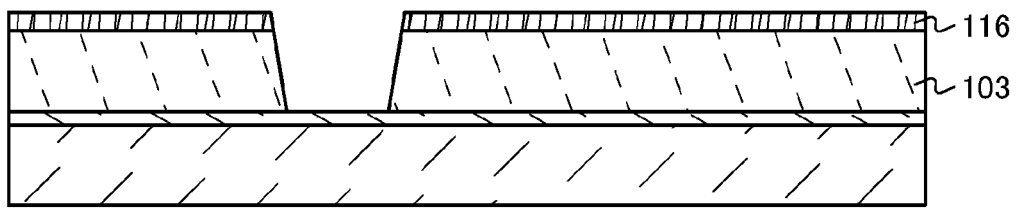
Figure 8C:
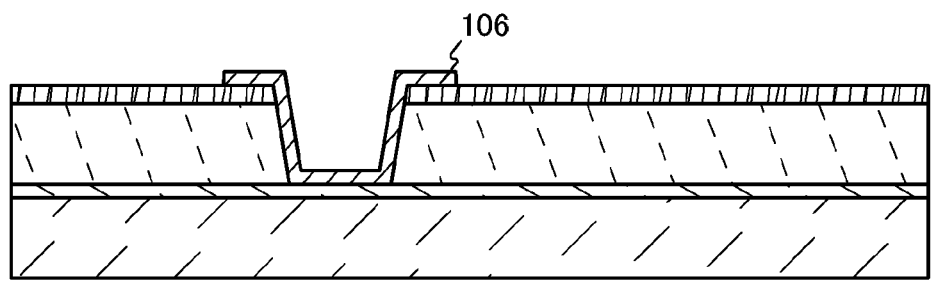
Figure 8D:
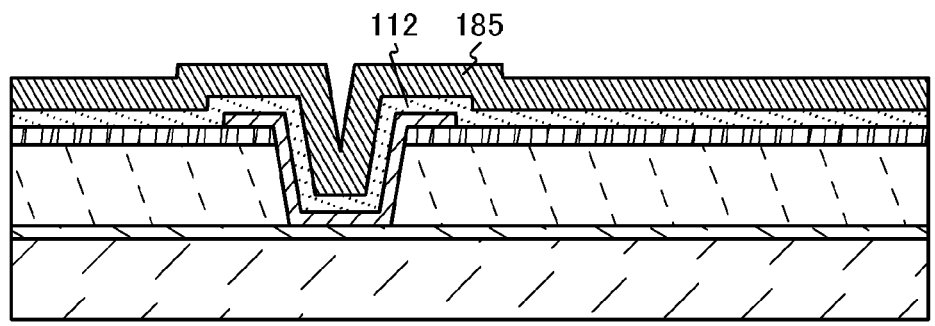

Next, the oxide semiconductor film 106 which is in contact with the pair of electrodes 116 and the side surfaces and bottom surface of a groove portion formed in the insulating film 103 is formed (see FIG. 8C). For formation of the oxide semiconductor film 106, an oxide semiconductor film that is to be the oxide semiconductor film 106 may be formed and then heat treatment may be performed. The heat treatment is performed at from 150° C. to 650° C. inclusive, preferably at from 250° C. to 450° C. inclusive. By the heat treatment, oxygen is released from at least one of the base insulating film 102 and the insulating film 103, so that defects in the oxide semiconductor film and in the vicinity of the interface of the oxide semiconductor film can be reduced. In this case, after heat treatment, the oxide semiconductor film may be processed to form the oxide semiconductor film 106. Further, a treatment for reducing resistance may be performed on part of the oxide semiconductor film 106 by an ion implantation method or an ion doping method. A region where resistance is reduced can be a lightly doped drain (LDD) region. When the LDD region is provided, deterioration of the transistor, caused by hot carriers or the like, can be suppressed, and thus, a highly reliable transistor can be manufactured.

Next, the gate insulating film 112 is formed. Then, a conductive film 185 is formed (see FIG. 8D). Note that heat treatment may be performed after the gate insulating film 112 is formed. The heat treatment is performed at from 150° C. to 650° C. inclusive, preferably at from 250° C. to 450° C. inclusive. By the heat treatment, oxygen is released from the gate insulating film 112, so that defects in the oxide semiconductor film 106 and in the vicinity of the interface of the oxide semiconductor film 106 can be reduced. The timing for performing this heat treatment is not limited to the timing just after formation of the gate insulating film 112. This heat treatment may be performed just after formation of the conductive film 185 or after any of steps performed after formation of the gate insulating film 112.

Next, the conductive film 185 is processed to form the gate electrode 104 overlapping with the oxide semiconductor film 106 and the second capacitor electrode 105 overlapping with one of the pair of electrodes 116. Through the above steps, the transistor 150 and the capacitor 160 illustrated in FIGS. 2A to 2C can be manufactured.

As described above, the transistor 150 and the capacitor 160 can be manufactured at the same time, whereby the number of steps in photolithography needed for manufacturing a semiconductor memory device can be reduced. Further, for forming the pair of electrodes 116 and the insulating film 103 to be substantially aligned with each other as viewed from above, both the pair of electrodes 116 and the insulating film 103 can be processed with use of the same mask or the insulating film 103 can be processed with use of the pair of electrodes 116 as a mask. As a result, the number of steps in photolithography or the number of photomasks needed for the photolithography can be reduced.

Note that plasma treatment such as a reverse sputtering treatment may be performed on the pair of electrodes 116. When such a treatment is performed, the upper end portions of the pair of electrodes 116 can be rounded to have curved surfaces, and thus the coverage with the oxide semiconductor film 106 and the gate insulating film 112 formed thereover can be improved. Alternatively, at the same time of processing the insulating film 183 with use of the pair of electrodes 116 as a mask to form the insulating film 103, the upper end portions of the pair of electrodes 116 may be rounded to have curved surfaces.

According to this embodiment, a semiconductor memory device in which with a channel region formed in accordance with a shape of a groove portion in a transistor, the influence caused by the short-channel effect is reduced even when the integration degree is increased is provided. In manufacture of such a semiconductor memory device, the number of steps in photolithography is smaller than that of photolithography needed for manufacturing a conventional device.

This embodiment can be implemented in appropriate combination with the other embodiments.

Embodiment 3

Figure 3A:
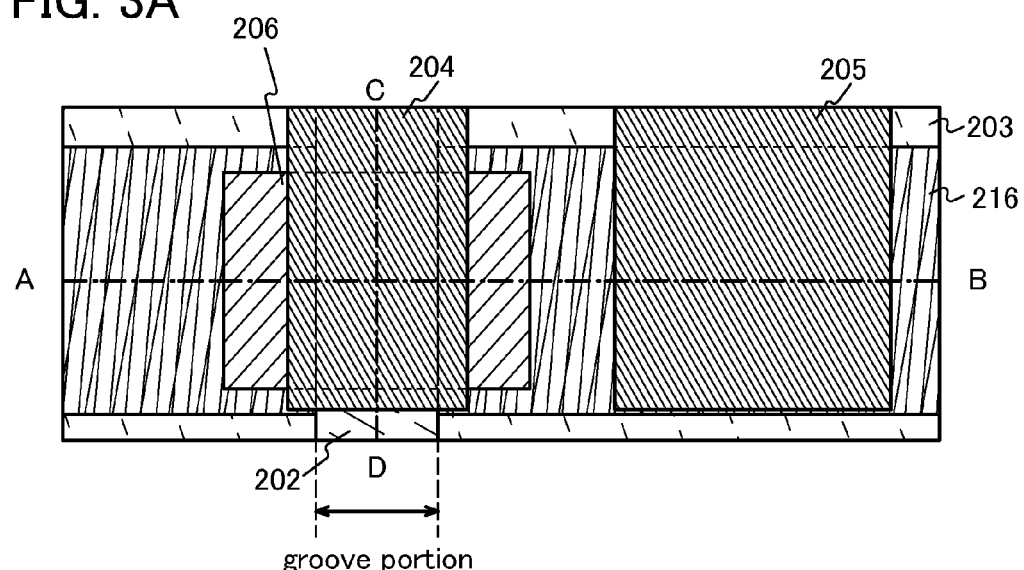
FIGS. 3A to 3C are a top view and cross-sectional views illustrating an example of a semiconductor memory device according to one embodiment of the present invention.
Figure 3B:
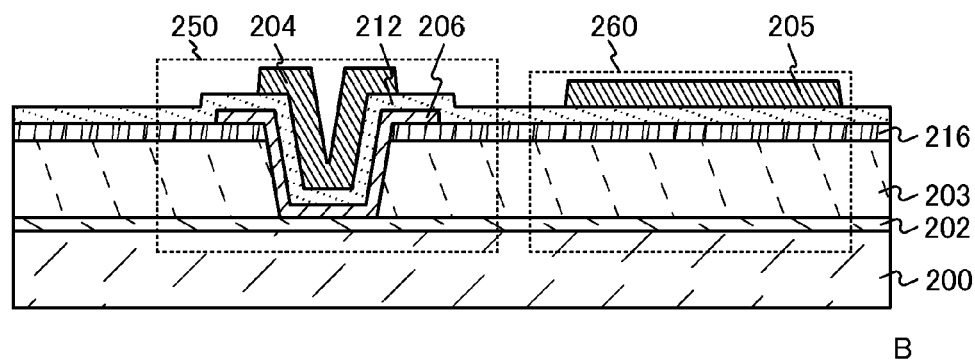
Figure 3C:
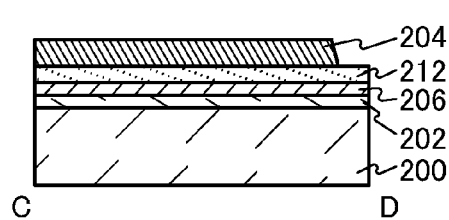

FIGS. 3A to 3C are a top view and cross-sectional views illustrating a transistor 250 and a capacitor 260 which respectively correspond to the transistor Tr and the capacitor C included in the memory cell CL. FIG. 3B illustrates a cross section A-B along dashed-dotted line A-B in FIG. 3A, and FIG. 3C illustrates a cross section C-D along dashed-dotted line C-D in FIG. 3A.

A semiconductor memory device includes the transistor 250 and the capacitor 260. The transistor 250 includes: a substrate 200; a base insulating film 202 over the substrate 200; an insulating film 203 provided over the base insulating film 202 and having a groove portion; a pair of electrodes 216 which is provided over the insulating film 203 and substantially aligned with one side surface of the insulating film 203 viewed from above; an oxide semiconductor film 206 in contact with the pair of electrodes 216 and side surfaces and a bottom surface of the groove portion formed in the insulating film 203; a gate insulating film 212 covering the oxide semiconductor film 206 and the pair of electrodes 216; and a gate electrode 204 overlapping with oxide semiconductor film 206 with the gate insulating film 212 positioned therebetween. The capacitor 260 includes: a dielectric film which is formed using the same material and in the same layer as the gate insulating film 212; a first capacitor electrode which is formed using the same material and in the same layer as the pair of electrodes 216; and a second capacitor electrode 205 which is formed using the same material and in the same layer as the gate electrode 204 and overlaps with the first capacitor electrode with the dielectric film positioned therebetween.

In the transistor 250, by formation of the groove portion in the insulating film 203, the length of a channel region formed in the oxide semiconductor film 206 (the effective channel length) can be longer than an apparent channel length that is a distance between the pair of electrodes 216 viewed from above. For example, the thickness of the insulating film 203 is adjusted so that the value of the thickness of the insulating film 203 can be larger than the value of the distance between the pair of electrodes 216 viewed from above, whereby the effective channel length can be three times or more the apparent channel length. In order to make the effective channel length longer than the apparent channel length, it is at least necessary that the oxide semiconductor film 206 is provided to have a smaller thickness than the insulating film 203.

Note that the substrate 200, the base insulating film 202, the insulating film 203, the pair of electrodes 216, the oxide semiconductor film 206, the gate insulating film 212, the gate electrode 204, and the second capacitor electrode 205 correspond to the substrate 1100, the base insulating film 102, the insulating film 1103, the pair of electrodes 1116, the oxide semiconductor film 1106, the gate insulating film 1112, the gate electrode 1104, and the second capacitor electrode 105, respectively.

In the transistor 250 having the above structure, with use of the oxide semiconductor film 206, the off-state current can be reduced to be less than or equal to $1 \times 10^{-18}$ A, preferably less than or equal to $1 \times 10^{-21}$ A, further preferably, less than or equal to $1 \times 10^{-24}$ A. As a result, in a semiconductor memory device, electric charge accumulated in the capacitor 260 can be hold for a long time, and the frequency of refresh operations can be reduced accordingly. Therefore, the power consumption of the semiconductor memory device can be lowered. In addition, since low frequency of operation of the transistor 250 brings less deterioration in electric characteristics of the transistor 250, a highly reliable semiconductor memory device can be provided.

Further, the oxide semiconductor film 206 is in contact with the side surfaces of the groove portion formed in the insulating film 203, whereby the effective channel length can be three times or more, preferably five times or more, further preferably ten times or more, the apparent channel length that is a distance between the pair of electrodes 216 viewed from above. Therefore, even when the transistor 250 is downsized, the influence caused by the short-channel effect can be reduced, and the integration degree of the semiconductor memory device can be increased.

An example of a manufacturing method of the transistor 250 and the capacitor 260 described in this embodiment is described with reference to FIGS. 9A to 9E.

First, the base insulating film 202 is formed over the substrate 200. Then, an insulating film 283 is formed. Then, a conductive film 284 is formed (see FIG. 9A). Note that the base insulating film 202, the insulating film 283, and the conductive film 284 may be successively formed without being exposed to the air. Such film formation method is preferable because the cleanliness of each interface of the layers can be improved and entry of impurities can be inhibited.

Next, a resist mask is formed over the conductive film 284 with a photolithography process or the like. With use of the resist mask, the conductive film 284 is processed to form a hard mask 294. Next, the insulating film 283 is processed to form the insulating film 203 with use of the hard mask 294 as a mask (see FIG. 9B). In this process, the conductive film 284 and the insulating film 283 may be processed with use of the same resist mask, so that the hard mask 294 and the insulating film 203 are formed. Alternatively, after the hard mask 294 is formed with use of a resist mask, the resist mask is removed, and the insulating film 283 may be processed with use of the hard mask 294 as a mask, so that the insulating film 203 is formed. As described above, the hard mask 294 and the insulating film 203 are substantially aligned with each other as viewed from above, whereby the number of steps in photolithography can be reduced.

Figure 9A:
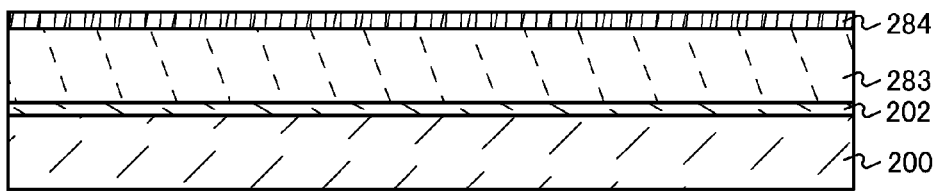
FIGS. 9A to 9E are cross-sectional views illustrating an example of a method for manufacturing a semiconductor memory device according to one embodiment of the present invention.
Figure 9B:
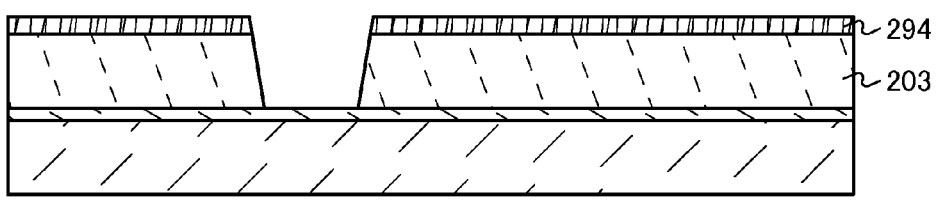
Figure 9C:
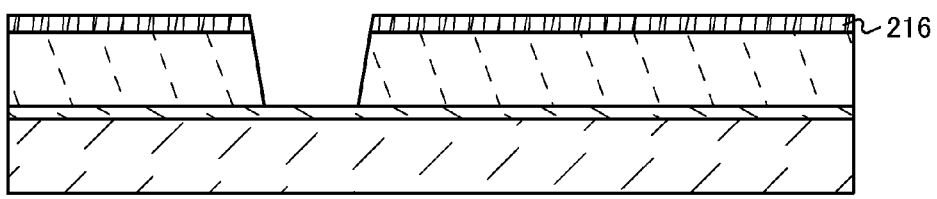

Next, the hard mask 294 is processed, so that the pair of electrodes 216 which is separated so that the groove portion formed in the insulating film 203 is sandwiched therebetween is formed (see FIG. 9C).

Figure 9D:
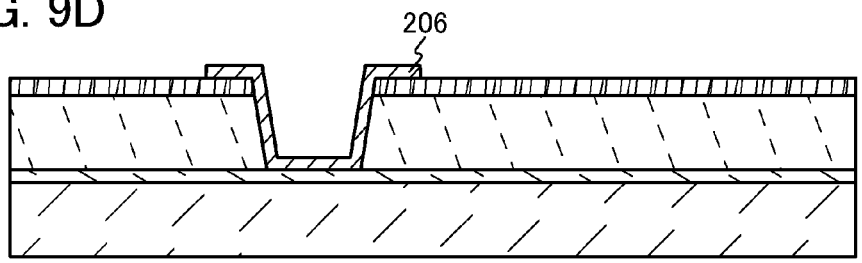
Figure 9E:
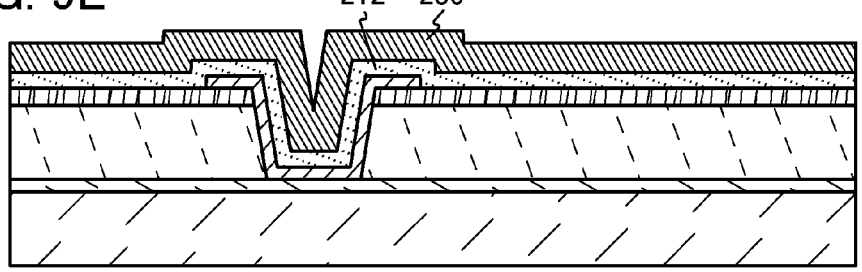

Next, the oxide semiconductor film 206 which is in contact with the pair of electrodes 216 and the side surfaces and bottom surface of the groove portion formed in the insulating film 203 is formed (see FIG. 9D). For formation of the oxide semiconductor film 206, an oxide semiconductor film that is to be the oxide semiconductor film 206 may be formed and then heat treatment may be performed. The heat treatment is performed at from 150° C. to 650° C. inclusive, preferably at from 250° C. to 450° C. inclusive. By the heat treatment, oxygen is released from at least one of the base insulating film 202 and the insulating film 203, so that defects in the oxide semiconductor film and in the vicinity of the interface of the oxide semiconductor film can be reduced. In this case, after the heat treatment, the oxide semiconductor film may be processed to form the oxide semiconductor film 206. Further, a treatment for reducing resistance may be performed on part of the oxide semiconductor film 206 by an ion implantation method or an ion doping method. A region where resistance is reduced can be a lightly doped drain (LDD) region. When the LDD region is provided, deterioration of the transistor, caused by hot carriers or the like, can be suppressed, and thus, a highly reliable transistor can be manufactured.

Next, the gate insulating film 212 is formed. Then, a conductive film 285 is formed (see FIG. 9E). Heat treatment may be performed after the gate insulating film 212 is formed. The heat treatment is performed at from 150° C. to 650° C. inclusive, preferably at from 250° C. to 450° C. inclusive. By the heat treatment, oxygen is released from the gate insulating film 212, so that defects in the oxide semiconductor film 206 and in the vicinity of the interface of the oxide semiconductor film 206 can be reduced. The timing for performing this heat treatment is not limited to the timing just after formation of the gate insulating film 212. This heat treatment may be performed just after formation of the conductive film 285 or after any of steps performed after formation of the gate insulating film 212.

Next, the conductive film 285 is processed to form the gate electrode 204 overlapping with the oxide semiconductor film 206 and a second capacitor electrode 205 overlapping with one of the pair of electrodes 216. Through the above steps, the transistor 250 and the capacitor 260 illustrated in FIGS. 3A to 3C can be manufactured.

As described above, the transistor 250 and the capacitor 260 can be manufactured at the same time, whereby the number of steps in photolithography needed for manufacturing a semiconductor memory device can be reduced. Further, for forming the hard mask 294 and the insulating film 203 to be substantially aligned with each other as viewed from above, both the hard mask 294 and the insulating film 203 can be processed with use of the same mask or the insulating film 203 can be processed with use of the hard mask 294 as a mask. As a result, the number of steps in photolithography can be reduced.

Note that plasma treatment such as a reverse sputtering treatment may be performed on the hard mask 294 or the pair of electrodes 216. When such a treatment is performed, the upper end portions of the hard mask 294 or the pair of electrodes 216 can be rounded to have curved surfaces, and thus the coverage with the oxide semiconductor film 206 and the gate insulating film 212 formed thereover can be improved. Alternatively, at the same time of processing the insulating film 283 with use of the hard mask 294 as a mask to form the insulating film 203, the upper end portions of the hard mask 294 may be rounded to have curved surfaces.

According to this embodiment, a semiconductor memory device in which with a channel region formed in accordance with a shape of a groove portion in a transistor, the influence caused by the short-channel effect is reduced even when the integration degree is increased is provided. In manufacture of such a semiconductor memory device, the number of steps in photolithography is smaller than that of photolithography needed for manufacturing a conventional device.

This embodiment can be implemented in appropriate combination with the other embodiments.

Embodiment 4

Figure 4A:
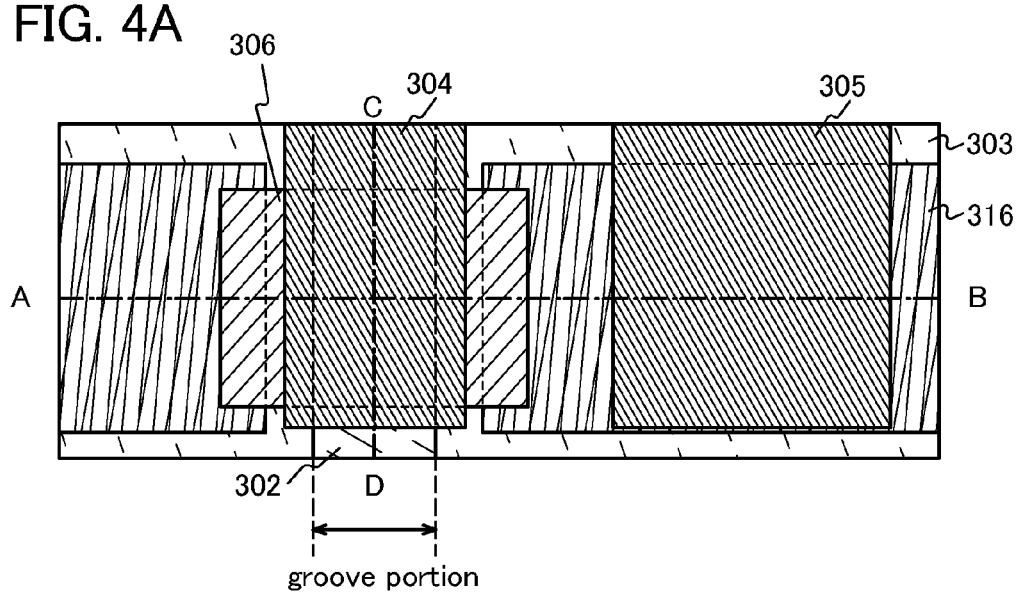
FIGS. 4A to 4C are a top view and cross-sectional views illustrating an example of a semiconductor memory device according to one embodiment of the present invention.
Figure 4B:
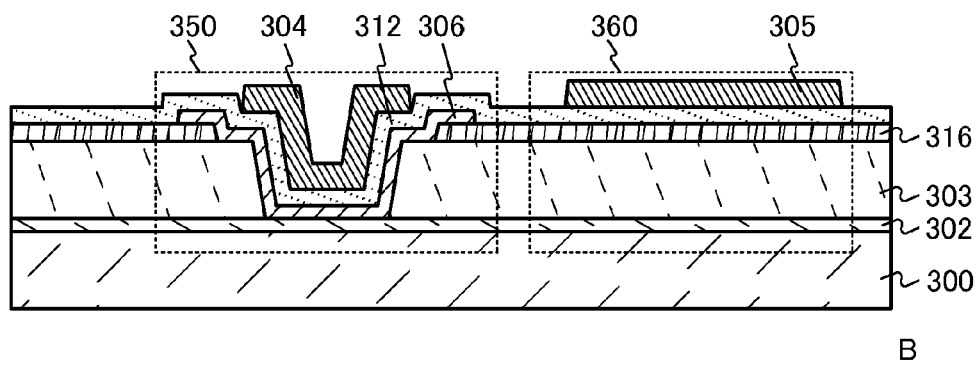
Figure 4C:
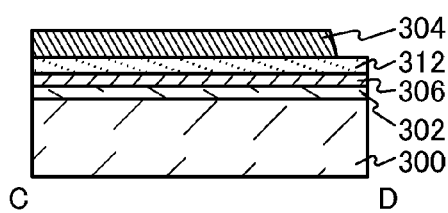

FIGS. 4A to 4C are a top view and cross-sectional views illustrating a transistor 350 and a capacitor 360 which respectively correspond to the transistor Tr and the capacitor C included in the memory cell CL. FIG. 4B illustrates a cross section A-B along dashed-dotted line A-B in FIG. 4A, and FIG. 4C illustrates a cross section C-D along dashed-dotted line C-D in FIG. 4A.

A semiconductor memory device includes the transistor 350 and the capacitor 360. The transistor 350 includes: a substrate 300; a base insulating film 302 over the substrate 300; an insulating film 303 provided over the base insulating film 302 and having a groove portion; a pair of electrodes 316 over the insulating film 303; an oxide semiconductor film 306 in contact with the pair of electrodes 316 and side surfaces and a bottom surface of the groove portion formed in the insulating film 303; a gate insulating film 312 covering the oxide semiconductor film 306 and the pair of electrodes 316; and a gate electrode 304 overlapping with the oxide semiconductor film 306 with the gate insulating film 312 positioned therebetween. The capacitor 360 includes: a dielectric film which is formed using the same material and in the same layer as the gate insulating film 312; a first capacitor electrode which is formed using the same material and in the same layer as the pair of electrodes 316; and a second capacitor electrode 305 which is formed using the same material and in the same layer as the gate electrode 304 and overlaps with the first capacitor electrode with the dielectric film positioned therebetween.

In the transistor 350, by formation of the groove portion in the insulating film 303, the length of a channel region formed in the oxide semiconductor film 306 (the effective channel length) can be longer than an apparent channel length that is a distance between the pair of electrodes 316 viewed from above.

Note that the substrate 300, the base insulating film 302, the insulating film 303, the pair of electrodes 316, the oxide semiconductor film 306, the gate insulating film 312, the gate electrode 304, and the second capacitor electrode 305 correspond to the substrate 1100, the base insulating film 102, the insulating film 1103, the pair of electrodes 1116, the oxide semiconductor film 1106, the gate insulating film 1112, the gate electrode 1104, and the second capacitor electrode 105, respectively.

In the transistor 350 having the above structure, with use of the oxide semiconductor film 306, the off-state current can be reduced to be less than or equal to $1\times10^{-18}$ A, preferably less than or equal to $1\times10^{-21}$ A, further preferably, less than or equal to $1\times10^{-24}$ A. As a result, in a semiconductor memory device, electric charge accumulated in the capacitor 360 can be hold for a long time, and the frequency of refresh operations can be reduced accordingly. Therefore, the power consumption of the semiconductor memory device can be lowered. In addition, since low frequency of operation of the transistor 350 brings less deterioration in electric characteristics of the transistor 350, a highly reliable semiconductor memory device can be provided.

Further, the oxide semiconductor film 306 is in contact with the side surfaces of the groove portion formed in the insulating film 303, whereby the effective channel length can be three times or more, preferably five times or more, further preferably ten times or more, the apparent channel length that is a distance between the pair of electrodes 316 viewed from above. Therefore, even when the transistor 350 is downsized, the influence caused by the short-channel effect can be reduced, and the integration degree of the semiconductor memory device can be increased.

An example of a manufacturing method of the transistor 350 and the capacitor 360 described in this embodiment is described with reference to FIGS. 10A to 10D.

First, the base insulating film 302 is formed over the substrate 300. Then, an insulating film 383 is formed over the base insulating film 302 (see FIG. 10A).

Next, the insulating film is processed, so that the insulating film 303 in which a groove portion is provided is formed.

Figure 10A:
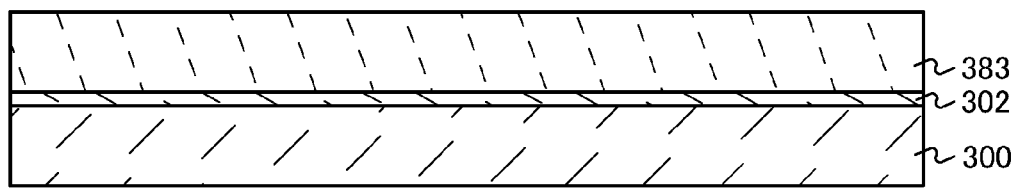
FIGS. 10A to 10D are cross-sectional views illustrating an example of a method for manufacturing a semiconductor memory device according to one embodiment of the present invention.
Figure 10B:
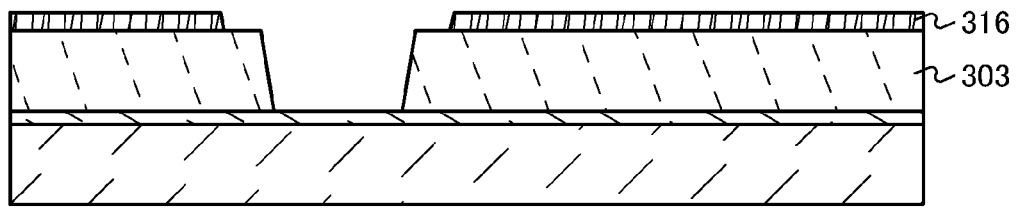

Next, a conductive film is formed, and then the conductive film is processed to form the pair of electrodes 316 which is separated so that the groove portion formed in the insulating film 303 is sandwiched therebetween (see FIG. 10B). Note that formation of the pair of electrodes 316 may follow after formation of the insulating film 383, and then the insulating film 383 may be processed to form the insulating film 303.

Figure 10C:
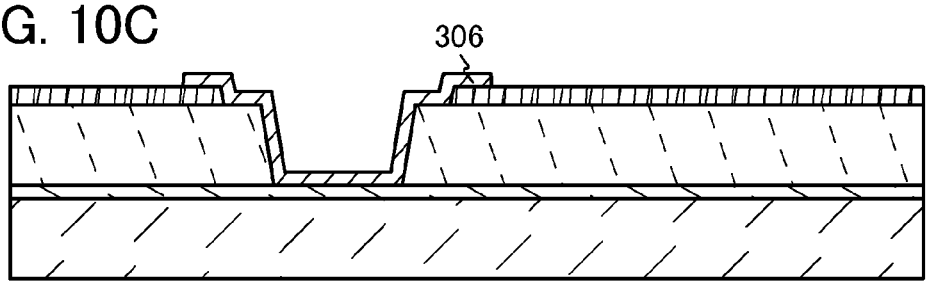
Figure 10D:
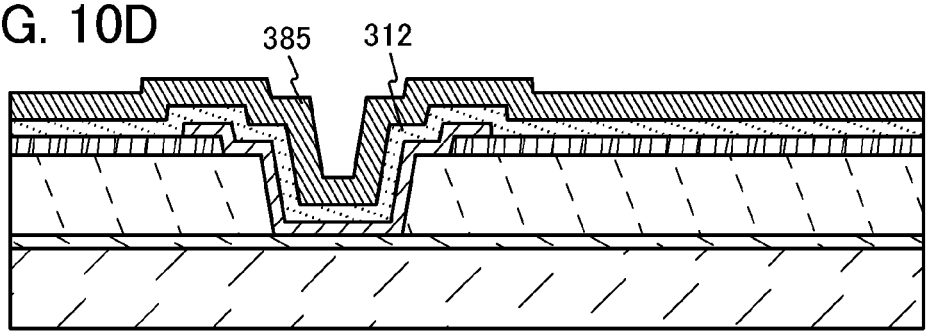

Next, the oxide semiconductor film 306 which is in contact with the pair of electrodes 316 and the side surfaces and bottom surface of the groove portion formed in the insulating film 303 is formed (see FIG. 10C). For formation of the oxide semiconductor film 306, an oxide semiconductor film that is to be the oxide semiconductor film 306 may be formed and then heat treatment may be performed. The heat treatment is performed at from 150° C. to 650° C. inclusive, preferably at from 250° C. to 450° C. inclusive. By the heat treatment, oxygen is released from at least one of the base insulating film 302 and the insulating film 303, so that defects in the oxide semiconductor film and in the vicinity of the interface of the oxide semiconductor film can be reduced. In this case, after the heat treatment, the oxide semiconductor film may be processed to form the oxide semiconductor film 306. Further, a treatment for reducing resistance may be performed on part of the oxide semiconductor film 306 by an ion implantation method or an ion doping method. A region where resistance is reduced can be a lightly doped drain (LDD) region. When the LDD region is provided, deterioration of the transistor, caused by hot carriers or the like, can be suppressed, and thus, a highly reliable transistor can be manufactured.

Next, the gate insulating film 312 is formed. Then, a conductive film 385 is formed (see FIG. 10D). Heat treatment may be performed after the gate insulating film 312 is formed. The heat treatment is performed at from 150° C. to 650° C. inclusive, preferably at from 250° C. to 450° C. inclusive. By the heat treatment, oxygen is released from the gate insulating film 312, so that defects in the oxide semiconductor film 306 and in the vicinity of the interface of the oxide semiconductor film 306 can be reduced. The timing for performing this heat treatment is not limited to the timing just after formation of the gate insulating film 312. This heat treatment may be performed just after formation of the conductive film 385 or in any step which is performed after formation of the gate insulating film 312.

Next, the conductive film 385 is processed to form the gate electrode 304 overlapping with the oxide semiconductor film 306 and the second capacitor electrode 305 overlapping with one of the pair of electrodes 316. Through the above steps, the transistor 350 and the capacitor 360 illustrated in FIGS. 4A to 4C can be manufactured.

As described above, the transistor 350 and the capacitor 360 can be manufactured at the same time, whereby the number of steps in photolithography needed for manufacturing a semiconductor memory device can be reduced.

Note that plasma treatment such as a reverse sputtering treatment may be performed on the pair of electrodes 316. When such a treatment is performed, the upper end portions of the pair of electrodes 316 can be rounded to have curved surfaces, and thus the coverage with the oxide semiconductor film 306 and the gate insulating film 312 formed thereover can be improved.

According to this embodiment, a semiconductor memory device in which with a channel region formed in accordance with a shape of a groove portion in a transistor, the influence caused by the short-channel effect is reduced even when the integration degree is increased is provided. In manufacture of such a semiconductor memory device, the number of steps in photolithography is smaller than that of photolithography needed for manufacturing a conventional device.

This embodiment can be implemented in appropriate combination with the other embodiments.

Embodiment 5

Figure 5A:
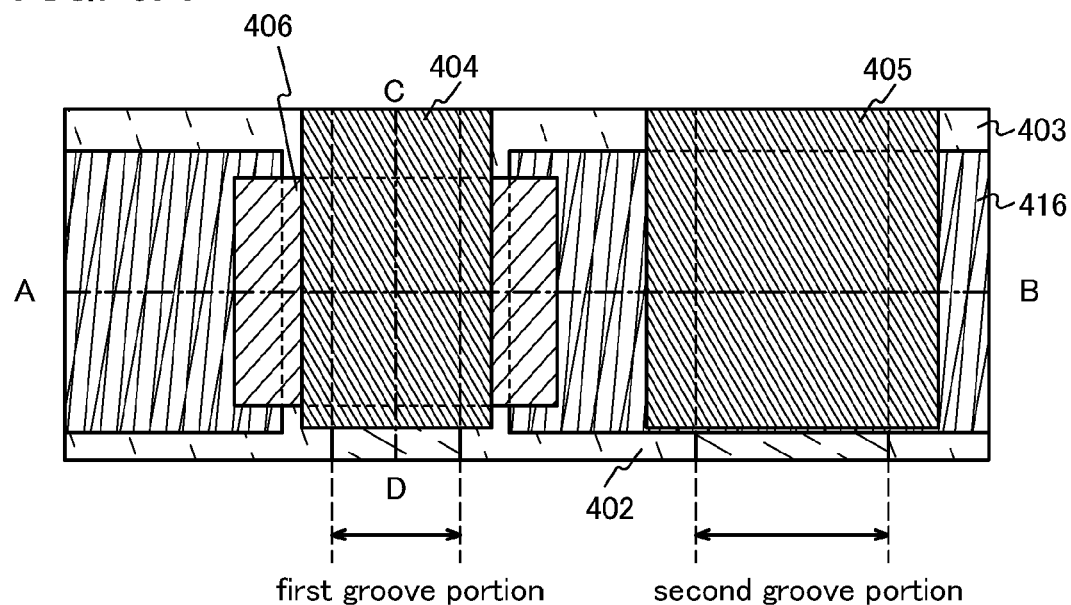
FIGS. 5A to 5C are a top view and cross-sectional views illustrating an example of a semiconductor memory device according to one embodiment of the present invention.
Figure 5B:
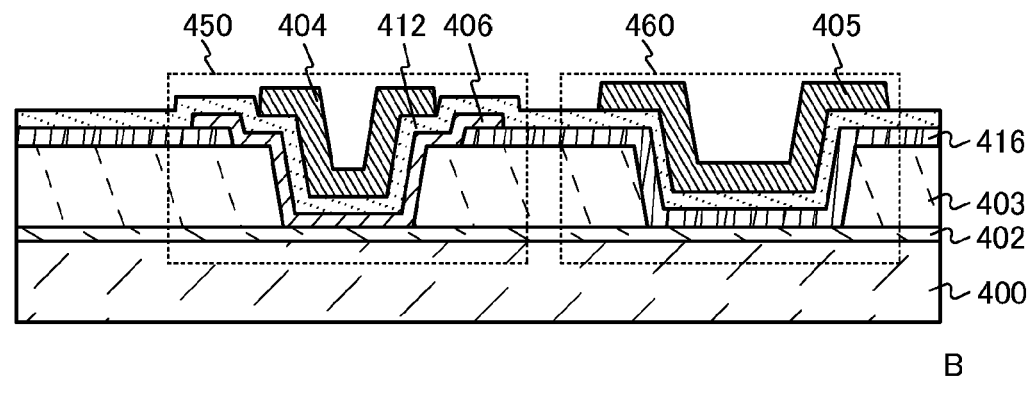
Figure 5C:
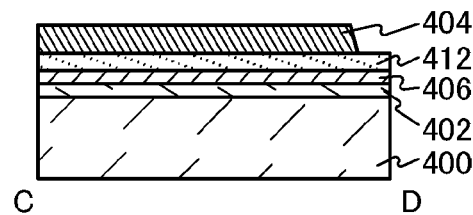

FIGS. 5A to 5C are a top view and cross-sectional views illustrating a transistor 450 and a capacitor 460 which respectively correspond to the transistor Tr and the capacitor C included in the memory cell CL. FIG. 5B illustrates a cross section A-B along dashed-dotted line A-B in FIG. 5A, and FIG. 5C illustrates a cross section C-D along dashed-dotted line C-D in FIG. 5A.

A semiconductor memory device includes the transistor 450 and the capacitor 460. The transistor 450 includes: a substrate 400; a base insulating film 402 over the substrate 400; an insulating film 403 provided over the base insulating film 402 and having a first groove portion and a second groove portion; a pair of electrodes 416 provided over the insulating film 403 and separated so that the first groove portion formed in the insulating film 403 is sandwiched therebetween; an oxide semiconductor film 406 in contact with the pair of electrodes 416 and side surfaces and a bottom surface of the first groove portion formed in the insulating film 403; a gate insulating film 412 covering the oxide semiconductor film 406 and the pair of electrodes 416; and a gate electrode 404 overlapping with the oxide semiconductor film 406 with the gate insulating film 412 positioned therebetween. The capacitor 460 includes: a dielectric film which is formed using the same material and in the same layer as the gate insulating film 412; a first capacitor electrode which is formed using the same material and in the same layer as the pair of electrodes 416 to have a shape along the second groove portion formed in the insulating film 403; and a second capacitor electrode 405 which is formed using the same material and in the same layer as the gate electrode 404 and overlaps with the first capacitor electrode and the second groove portion formed in the insulating film 403, with the dielectric film positioned therebetween.

In the transistor 450, by formation of the first groove portion in the insulating film 403, the length of a channel region formed in the oxide semiconductor film 406 (the effective channel length) can be longer than an apparent channel length that is a distance between the pair of electrodes 416 viewed from above.

When the capacitor 460 has the second groove portion formed in the insulating film 403, the area of the second capacitor electrode 405 of the capacitor 460 (the effective area of the capacitor 460) can be larger than the area of the second capacitor electrode 405 as viewed from above.

Note that the substrate 400, the base insulating film 402, the insulating film 403, the pair of electrodes 416, the oxide semiconductor film 406, the gate insulating film 412, the gate electrode 404, and the second capacitor electrode 405 correspond to the substrate 1100, the base insulating film 102, the insulating film 1103, the pair of electrodes 1116, the oxide semiconductor film 1106, the gate insulating film 1112, the gate electrode 1104, and the second capacitor electrode 105, respectively.

In the transistor 450 having the above structure, with use of the oxide semiconductor film 406, the off-state current can be reduced to be less than or equal to $1\times10^{-18}$ A, preferably less than or equal to $1\times10^{-21}$ A, further preferably, less than or equal to $1\times10^{-24}$ A. As a result, in a semiconductor memory device, electric charge accumulated in the capacitor 460 can be hold for a long time, and the frequency of refresh operations can be reduced accordingly. Therefore, the power consumption of the semiconductor memory device can be lowered. In addition, since low frequency of operation of the transistor 450 brings less deterioration in electric characteristics of the transistor 450, a highly reliable semiconductor memory device can be provided.

Further, the oxide semiconductor film 406 is in contact with the side surfaces of the first groove portion formed in the insulating film 403, whereby the effective channel length can be three times or more, preferably five times or more, further preferably ten times or more, the apparent channel length that is a distance between the pair of electrodes 416 viewed from above. Therefore, even when the transistor 450 is downsized, the influence caused by the short-channel effect can be reduced, and the integration degree of the semiconductor memory device can be increased.

Further, when the second groove portion is formed in the insulating film 403, and the first capacitor electrode, the dielectric film, and the second capacitor electrode 405 are formed to overlap with the second groove portion, the effective area of the capacitor 460 can be three times or more, preferably five times or more, further preferably ten times or more, the apparent area of the capacitor 460, which is the area of the second capacitor electrode 405 viewed from above. Therefore, even when the capacitor 460 is downsized, the sufficient amount of capacitance can be obtained, and the degree of the integration of the semiconductor memory device can be increased.

An example of a manufacturing method of the transistor 450 and the capacitor 460 described in this embodiment is described with reference to FIGS. 11A to 11D.

First, the base insulating film 402 is formed over the substrate 400. Then, an insulating film is formed over the base insulating film 402. Then, the insulating film is processed to form the insulating film 403 in which the first groove portion and the second groove portion are provided (see FIG. 11A).

Figure 11A:
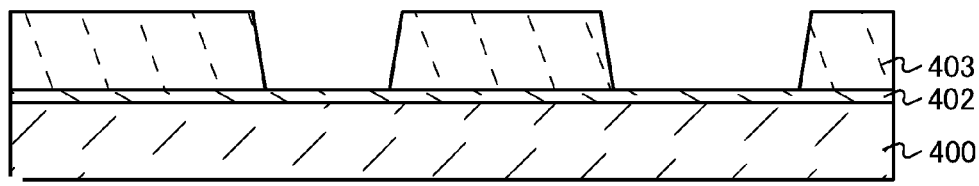
FIGS. 11A to 11D are cross-sectional views illustrating an example of a method for manufacturing a semiconductor memory device according to one embodiment of the present invention.
Figure 11B:
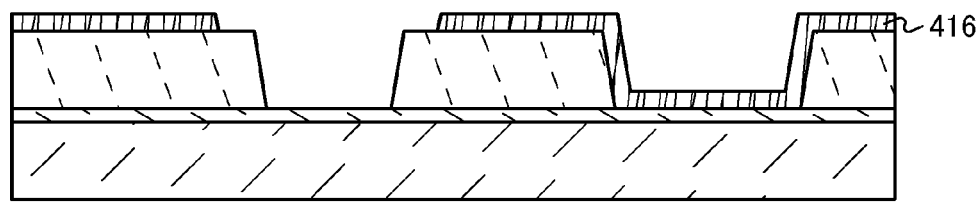

Next, a conductive film is formed, and then the conductive film is processed to form the pair of electrodes 416 which is separated so that the first groove portion formed in the insulating film 403 is sandwiched therebetween and which overlaps with the second groove portion formed in the insulating film 403 (see FIG. 11B).

Figure 11C:
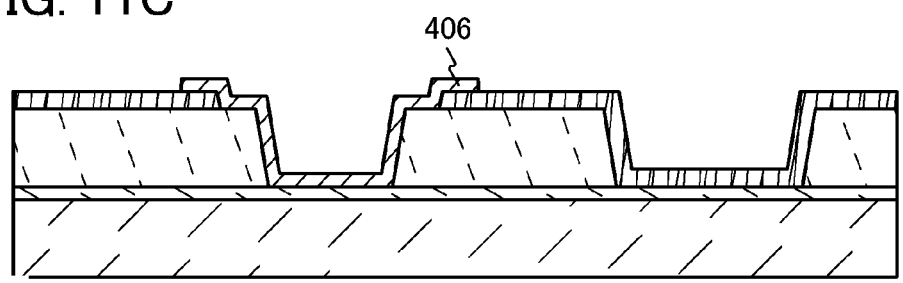
Figure 11D:
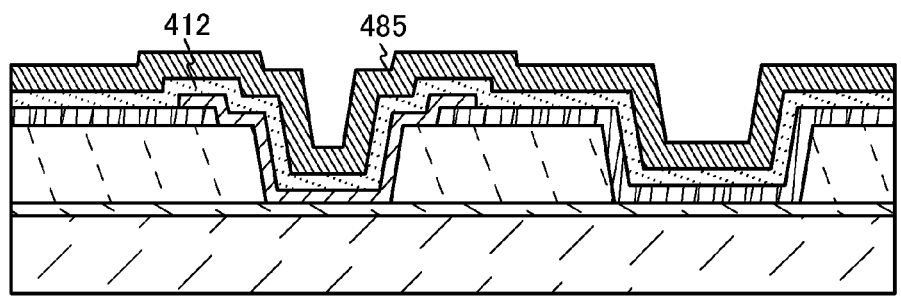

Next, the oxide semiconductor film 406 which is in contact with the pair of electrodes and the side surfaces and bottom surface of the first groove portion formed in the insulating film 403 is formed (see FIG. 11C). For formation of the oxide semiconductor film 406, an oxide semiconductor film that is to be the oxide semiconductor film 406 may be formed and then heat treatment may be performed. The heat treatment is performed at from 150° C. to 650° C. inclusive, preferably at from 250° C. to 450° C. inclusive. By the heat treatment, oxygen is released from at least one of the base insulating film 402 and the insulating film 403, so that defects in the oxide semiconductor film and in the vicinity of the interface of the oxide semiconductor film can be reduced. In this case, after the heat treatment, the oxide semiconductor film may be processed to form the oxide semiconductor film 406. Further, a treatment for reducing resistance may be performed on part of the oxide semiconductor film 406 by an ion implantation method or an ion doping method. A region where resistance is reduced can be a lightly doped drain (LDD) region. When the LDD region is provided, deterioration of the transistor, caused by hot carriers or the like, can be suppressed, and thus, a highly reliable transistor can be manufactured.

Next, the gate insulating film 412 is formed. Then, a conductive film 485 is formed (see FIG. 11D). Heat treatment may be performed after the gate insulating film 412 is formed. The heat treatment is performed at from 150° C. to 650° C. inclusive, preferably at from 250° C. to 450° C. inclusive. By the heat treatment, oxygen is released from the gate insulating film 412, so that defects in the oxide semiconductor film 406 and in the vicinity of the interface of the oxide semiconductor film 406 can be reduced. The timing for performing this heat treatment is not limited to the timing just after formation of the gate insulating film 412. This heat treatment may be performed just after formation of the conductive film 485 or after any of steps performed after formation of the gate insulating film 412.

Next, the conductive film 485 is processed to form the gate electrode 404 overlapping with the oxide semiconductor film 406 and the second capacitor electrode 405 overlapping with the second groove portion formed in the insulating film 403 and one of the pair of electrodes 416. Through the above steps, the transistor 450 and the capacitor 460 illustrated in FIGS. 5A to 5C can be manufactured.

As described above, the transistor 450 and the capacitor 460 can be manufactured at the same time, whereby the number of steps in photolithography can be reduced.

Note that plasma treatment such as a reverse sputtering treatment may be performed on the pair of electrodes 416. When such a treatment is performed, the upper end portions of the pair of electrodes 416 can be rounded to have curved surfaces, and thus the coverage with the oxide semiconductor film 406 and the gate insulating film 412 formed thereover can be improved.

According to this embodiment, a semiconductor memory device in which with a channel region formed in accordance with a shape of a groove portion in a transistor, the influence caused by the short-channel effect is reduced even when the integration degree is increased is provided. In manufacture of such a semiconductor memory device, the number of steps in photolithography is smaller than that of photolithography needed for manufacturing a conventional device. Furthermore, with a capacitor formed in accordance with a shape of a groove portion, a semiconductor memory device with high integration degree can be manufactured.

This embodiment can be implemented in appropriate combination with the other embodiments.

Embodiment 6

In this embodiment, examples of electric devices to which any of Embodiments 1 to 5 is applied will be described.

Figure 12A:
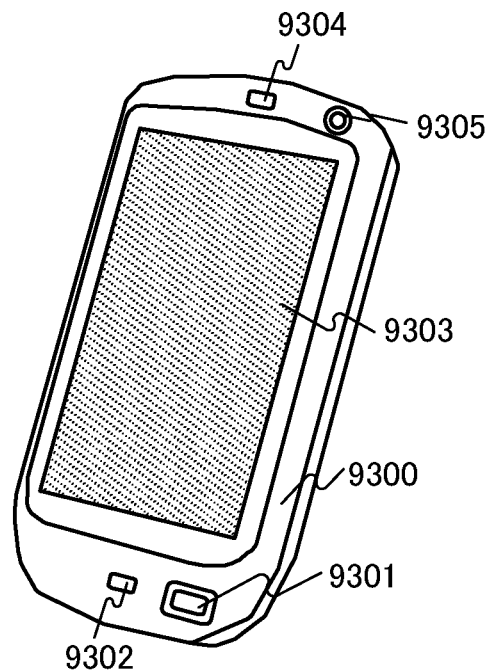
FIGS. 12A and 12B are perspective views each illustrating an example of an electronic device which is one embodiment of the present invention.

FIG. 12A illustrates a portable information terminal. The portable information terminal includes a housing 9300, a button 9301, a microphone 9302, a display portion 9303, a speaker 9304, and a camera 9305, and has a function as a mobile phone. One embodiment of the present invention can be applied to a memory inside the electronic device.

Figure 12B:
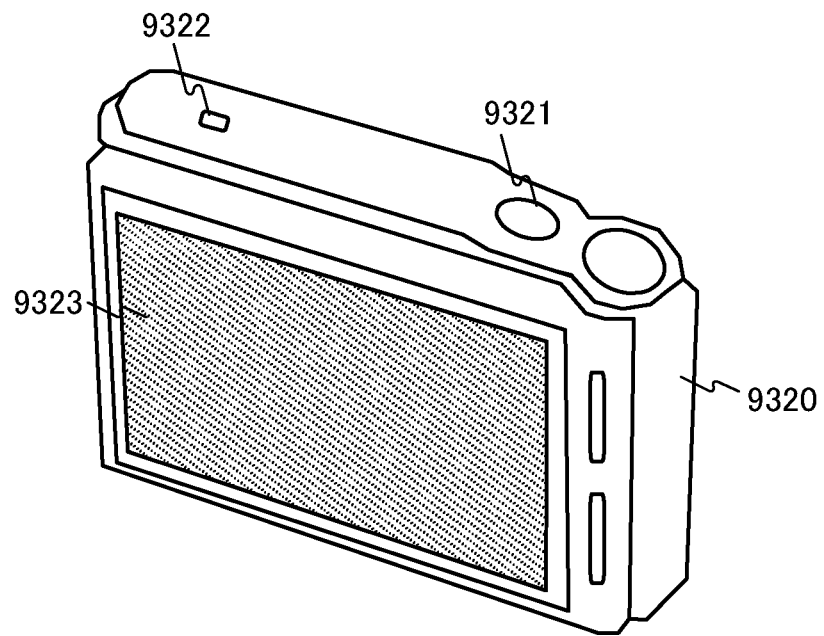

FIG. 12B illustrates a digital still camera. The digital still camera includes a housing 9320, a button 9321, a microphone 9322, and a display portion 9323. One embodiment of the present invention can be applied to a memory inside the electronic device.

When one embodiment of the present invention is employed, cost of an electronic device can be reduced. In addition, consumed power can be reduced, and reliability can be improved.

This embodiment can be implemented in appropriate combination with the other embodiments.

This application is based on Japanese Patent Application serial no. 2011-045913 filed with Japan Patent Office on Mar. 3, 2011, the entire contents of which are hereby incorporated by reference.

What is claimed is:

1. A semiconductor memory device comprising:
a memory cell comprising a transistor and a capacitor,
wherein the transistor comprises:
   a pair of electrodes over an insulating film including a groove portion;
   an oxide semiconductor film in contact with the pair of electrodes and side surfaces of the groove portion, the oxide semiconductor film including a first depression portion overlapping with the groove portion;
   a gate insulating film over the oxide semiconductor film; and
   a gate electrode over the gate insulating film; and
wherein the capacitor comprises:
   a dielectric film over one of the pair of electrodes; and
   a conductive film over the dielectric film,
wherein the conductive film is formed from the same layer as the gate electrode,
wherein the dielectric film is provided in the same layer as the gate insulating film,
wherein the gate electrode of the transistor is electrically connected to a word line,
wherein the other of the pair of electrodes of the transistor is electrically connected to a bit line, and
wherein the oxide semiconductor film comprises a crystal part whose c-axis is aligned in a direction parallel to a normal vector of the side surfaces of the groove portion.

2. The semiconductor memory device according to claim 1, wherein the oxide semiconductor film is in contact with a bottom surface of the groove portion.

3. The semiconductor memory device according to claim 1, wherein the side surfaces of the groove portion are coextensive with side surfaces of the pair of electrodes.

4. The semiconductor memory device according to claim 1, wherein the gate electrode includes a second depression portion overlapping with the groove portion.

5. The semiconductor memory device according to claim 1, wherein the conductive film of the capacitor is grounded.

6. A semiconductor memory device comprising:
a memory cell comprising a transistor and a capacitor,
wherein the transistor comprises:
   a pair of electrodes over an insulating film including a groove portion;
   an oxide semiconductor film in contact with the pair of electrodes and side surfaces of the groove portion, the oxide semiconductor film including a first depression portion overlapping with the groove portion;
   a gate insulating film over the oxide semiconductor film; and
   a gate electrode over the gate insulating film; and
wherein the capacitor comprises:
   a dielectric film over one of the pair of electrodes; and
   a conductive film over the dielectric film,
wherein the conductive film includes the same material as the gate electrode,
wherein the dielectric film includes the same material as the gate insulating film,
wherein the conductive film is formed from the same layer as the gate electrode,
wherein the dielectric film is provided in the same layer as the gate insulating film,
wherein the gate electrode of the transistor is electrically connected to a word line,
wherein the other of the pair of electrodes of the transistor is electrically connected to a bit line, and
wherein the oxide semiconductor film comprises a crystal part whose c-axis is aligned in a direction parallel to a normal vector of the side surfaces of the groove portion.

7. The semiconductor memory device according to claim 6, wherein the oxide semiconductor film is in contact with a bottom surface of the groove portion.

8. The semiconductor memory device according to claim 6, wherein the side surfaces of the groove portion are coextensive with side surfaces of the pair of electrodes.

9. The semiconductor memory device according to claim 6, wherein the gate electrode includes a second depression portion overlapping with the groove portion.

10. The semiconductor memory device according to claim 6, wherein the conductive film of the capacitor is grounded.

11. A semiconductor memory device comprising:
a memory cell comprising a transistor and a capacitor,
wherein the transistor comprises:
   a pair of electrodes over an insulating film including a groove portion;
   an oxide semiconductor film in contact with the pair of electrodes and side surfaces of the groove portion, the oxide semiconductor film having a thickness value smaller than a depth value of the groove portion;
   a gate insulating film over the oxide semiconductor film; and
   a gate electrode over the gate insulating film; and
wherein the capacitor comprises:
   a dielectric film over one of the pair of electrodes; and
   a conductive film over the dielectric film,
wherein the conductive film includes the same material as the gate electrode,
wherein the dielectric film includes the same material as the gate insulating film,
wherein the conductive film is formed from the same layer as the gate electrode,
wherein the dielectric film is provided in the same layer as the gate insulating film,
wherein the gate electrode of the transistor is electrically connected to a word line,
wherein the other of the pair of electrodes of the transistor is electrically connected to a bit line, and
wherein the oxide semiconductor film comprises a crystal part whose c-axis is aligned in a direction parallel to a normal vector of the side surfaces of the groove portion.

12. The semiconductor memory device according to claim 11, wherein the oxide semiconductor film is in contact with a bottom surface of the groove portion.

13. The semiconductor memory device according to claim 11, wherein the oxide semiconductor film includes a first depression portion overlapping with the groove portion.

14. The semiconductor memory device according to claim 11, wherein the gate electrode includes a second depression portion overlapping with the groove portion.

15. The semiconductor memory device according to claim 11, wherein the conductive film of the capacitor is grounded.

* * * * *